(12) United States Patent
Zawada et al.

(10) Patent No.: US 10,361,356 B2
(45) Date of Patent: Jul. 23, 2019

(54) PIEZOELECTRIC ENERGY HARVESTING

(71) Applicant: MEGGITT A/S, Kvistgaard (DK)

(72) Inventors: Tomasz Zawada, Frederiksberg (DK);
Ruichao Xu, København SV (DK);
Michele Guizzetti, Helsingør (DK);
Louise Møller Borregaard, København Ø (DK); Erling Ringgaard, Bagsværd (DK)

(73) Assignee: MEGGITT A/S, Kvistgaard (DK)

( * ) Notice: Subject to any disclaimer, the term of this patent is extended or adjusted under 35 U.S.C. 154(b) by 234 days.

(21) Appl. No.: 15/021,682

(22) PCT Filed: Sep. 15, 2014

(86) PCT No.: PCT/IB2014/002654
§ 371 (c)(1),
(2) Date: Mar. 11, 2016

(87) PCT Pub. No.: WO2015/036869
PCT Pub. Date: Mar. 19, 2015

(65) Prior Publication Data
US 2016/0233413 A1    Aug. 11, 2016

Related U.S. Application Data

(60) Provisional application No. 61/877,828, filed on Sep. 13, 2013.

(51) Int. Cl.
*H01L 41/113*    (2006.01)
*H01L 41/053*    (2006.01)
(Continued)

(52) U.S. Cl.
CPC ........ *H01L 41/1136* (2013.01); *H01L 41/053* (2013.01); *H02N 2/186* (2013.01); *H01L 41/18* (2013.01)

(58) Field of Classification Search
CPC .............. H01L 41/113; H01L 41/1132; H01L 41/1134; H01L 41/1136; H01L 41/1138
(Continued)

(56) References Cited

U.S. PATENT DOCUMENTS

2003/0214200 A1* 11/2003 Thompson ................ G01L 1/16
310/329
2007/0114890 A1* 5/2007 Churchill ............ H01L 41/1136
310/339
(Continued)

OTHER PUBLICATIONS

Plessis Du A. J. et al., "Resonant Packaged Piezoelectric Power Harvester for Machinery Health Monitoring", Proceedings of SPIE, SPIE International Society for Optical Engineering, US, vol. 5762, No. 1, Jan. 1, 2005, pp. 224-235, XP002438710.
(Continued)

*Primary Examiner* — Derek J Rosenau
(74) *Attorney, Agent, or Firm* — Hackler Daghighian Martino & Novak

(57) ABSTRACT

An energy harvesting unit comprising: a package formed by a base and a lid, the package including a sealed interior volume and an exterior; a ledge formed in the sealed interior volume with a first cavity above and a second cavity below the ledge; a plurality of inner electrical contacts formed on the ledge; a plurality of outer electrical contacts formed on the exterior of the package wherein the outer electrical contacts are electrically connected to the inner electrical contacts through the package; and, a piezo-electric member in electrical communication with the inner electrical contacts and coupled to the ledge on a first side of the package and spanning across the cavity and coupled to the ledge on an opposite side of the package.

22 Claims, 27 Drawing Sheets

(51) Int. Cl.
*H02N 2/18* (2006.01)
*H01L 41/18* (2006.01)

(58) Field of Classification Search
USPC .................................................. 310/329, 339
See application file for complete search history.

(56) References Cited

U.S. PATENT DOCUMENTS

| | | | | |
|---|---|---|---|---|
| 2008/0079333 A1* | 4/2008 | Ulm | ................... | B60C 23/0411 |
| | | | | 310/339 |
| 2009/0211353 A1* | 8/2009 | Gao | ................... | B60C 23/0411 |
| | | | | 73/146.5 |
| 2013/0088123 A1 | 4/2013 | Haskett | | |
| 2013/0127295 A1* | 5/2013 | Jun | ..................... | H01L 41/1134 |
| | | | | 310/327 |
| 2013/0313946 A1* | 11/2013 | Lee | ....................... | H02N 2/188 |
| | | | | 310/339 |
| 2013/0341936 A1* | 12/2013 | Wood | .................... | H02N 2/188 |
| | | | | 290/1 R |

OTHER PUBLICATIONS

PCT International Search Report and Written Opinion of the PCT International Searching Authority, for International Application No. PCT/IB2014/002654, International Filing Date: Sep. 15, 2014, International Searching Authority, European Patent Office, dated Mar. 6, 2015, pp. 1-11.

* cited by examiner

PIEZOELECTRIC ENERGY HARVESTING

The present patent document relates to piezoelectric energy harvesting. More particularly, the present patent document relates to apparatuses, methods, and systems for converting mechanical energy into electrical energy using a piezoelectric member.

BACKGROUND

Mechanical movement, including vibration, may be caused by any number of things. Mechanical movement may come in numerous forms, including but not limited to harmonic vibration, non-harmonic vibration, rotation, displacement, torque, acceleration or acoustic wave. Through the process of the piezoelectric effect, mechanical movement may induce the formation of an electric charge in certain materials in response to applied mechanical stress. The electric charge that builds up is known as piezoelectricity and it was discovered in 1880 by French physicists Jacques and Pierre Curie.

In various different applications, it would be beneficial to take advantage of the mechanical movement or vibration a system encounters in order to create electricity to power some portion of the system. This portion of the system may be any size and may be limited to a single component or may include the entire system.

Piezoelectric devices are known. However, none of the devices are currently packaged and designed in a way to create an effective energy harvester.

SUMMARY OF THE EMBODIMENTS

In view of the foregoing, an object according to one aspect of the present patent document is to provide piezoelectric energy harvester. Preferably the methods and apparatuses address, or at least ameliorate one or more of the problems described above. To this end, an energy harvesting device is provided. In a preferred embodiment, the energy harvesting device comprises a package with an interior and an exterior; a piezoelectric member coupled to the interior of the package and configured to convert kinetic energy into electric energy; and electrical contacts on the exterior of the package in electrical communication with the piezoelectric member.

In some embodiments, the package of the energy harvesting device comprises a base, and a lid sealed to the base. In some embodiments, the package is a leadless chip carrier.

In a preferred embodiment, the piezoelectric member is made from lead zirconate titanate (PZT). In other embodiments, other materials may be used including the combinations of materials and layers.

In the preferred embodiment, the piezoelectric member is a cantilevered beam. In some embodiments, a proof mass is coupled to the piezoelectric member. The size and location of the proof mass may be configured to tune the response of the piezoelectric member. In a preferred embodiment, the resonance of the piezoelectric member aligns with the expected input vibrations of the environment.

In some embodiments, the piezoelectric member has a Q-factor of 200 or less. In yet other embodiments, Q-factors lower than 150 and even lower than 100 may be used.

In one aspect of the present patent document, an energy harvesting unit is provided. In preferred embodiments, the energy harvesting unit comprises: a base including a first cavity forming a ledge in the base and a second cavity stepped down from the ledge; a plurality of electrical contacts formed on the ledge; a plurality of electrical contacts formed on a bottom of the base and in electrical communication with the electrical contacts formed on the ledge; a lid coupled to the base to form a sealed interior volume; and, a piezoelectric member located in the sealed volume and electrically coupled to the electrical contacts formed on the ledge, the piezoelectric member spanning across the second cavity and extending over the ledge on three sides, the piezoelectric member including at least two gaps positioned over the second cavity forming a cantilevered portion extending over the second cavity. In a preferred embodiment, the interior volume is hermetically sealed or vacuum sealed.

In some embodiments, the energy harvesting unit further comprises a proof mass coupled to the cantilevered portion of the piezoelectric member. In other embodiments, more than one proof mass may be used.

In some embodiments, the piezoelectric member is a bimorph member. In some embodiments, the piezoelectric member is manufactured using a ceramic multilayer technology. If ceramic multilayer technology is used in manufacture, the piezoelectric member may be manufactured using a tape casting.

In some embodiments, the energy harvesting unit may further comprise stops. In some preferred embodiments, the energy harvesting unit further comprises a first mechanical stop coupled to the lid and a second mechanical stop coupled to the base. In yet other embodiments, the energy harvesting unit further comprises a first mechanical stop coupled to a top of the proof mass and a second mechanical stop coupled to a bottom of the proof mass.

In embodiments that include stops, the stops may be magnetic instead of mechanical. In preferred embodiments that use magnetic stops, the energy harvesting unit further comprises a magnet coupled to the proof mass and a first magnetic stop coupled to the lid and a second magnetic stop coupled to the base.

In some embodiments, the energy harvesting unit comprises one or more magnetic proof masses enabling magnetic coupling to an external magnetic field.

In another aspect of the present patent document, an energy harvesting unit is provided. In preferred embodiments, the energy harvesting unit comprises: a package formed by a base and a lid, the package including a sealed interior volume and an exterior; a ledge formed in the sealed interior volume with a first cavity above and a second cavity below the ledge; a plurality of inner electrical contacts formed on the ledge; a plurality of outer electrical contacts formed on the exterior of the package wherein the outer electrical contacts are electrically connected to the inner electrical contacts through the package; and, a piezoelectric member in electrical communication with the inner electrical contacts and coupled to the ledge on a first side of the package and spanning across the cavity and coupled to the ledge on an opposite side of the package.

In some embodiments, the piezoelectric member includes a cantilevered portion surrounded by an outer frame on three sides and wherein the outer frame is coupled to the ledge on the first side and the opposite side and on an adjacent third side and wherein the cantilevered portion is suspended between the first and second cavity. In yet other embodiments, the energy harvesting unit comprises a piezoelectric member with a frame on all four sides. In still yet other embodiments, the piezoelectric member may be coupled to the ledge on only a single side.

Depending on the embodiment, the first cavity, second cavity and ledge may be formed in various locations. In some embodiments, the first cavity is formed in the lid and the ledge and the second cavity are formed in the base. In other embodiments, the first cavity, second cavity and ledge are all formed in the base.

In another aspect of the present patent document, a wireless sensing system is provided. In a preferred embodiment, the wireless sensing system comprises a base station; and a plurality of wireless sensor nodes wherein the sensor nodes include an energy harvesting device.

In some embodiments of the wireless sensing system, the plurality of wireless sensor nodes that include an energy harvesting device include the energy harvesting device within a package. In some embodiments, the plurality of wireless sensor nodes that include an energy harvesting device do not have a power source other than the energy harvesting device.

Preferred embodiments of a wireless sensing node comprise: a processing unit; at least one energy harvesting unit of claim; an energy management and storage module in electrical communication with the energy harvesting unit and the processing unit; and, a wireless communication module. In some embodiments, the wireless sensing node may further comprise at least one sensor component.

Further aspects, objects, desirable features, and advantages of the apparatus and methods disclosed herein will be better understood from the detailed description and drawings that follow in which various embodiments are illustrated by way of example. It is to be expressly understood, however, that the drawings are for the purpose of illustration only and are not intended as a definition of the limits of the claimed invention.

DETAILED DESCRIPTION OF THE EMBODIMENTS

Figure 1B:
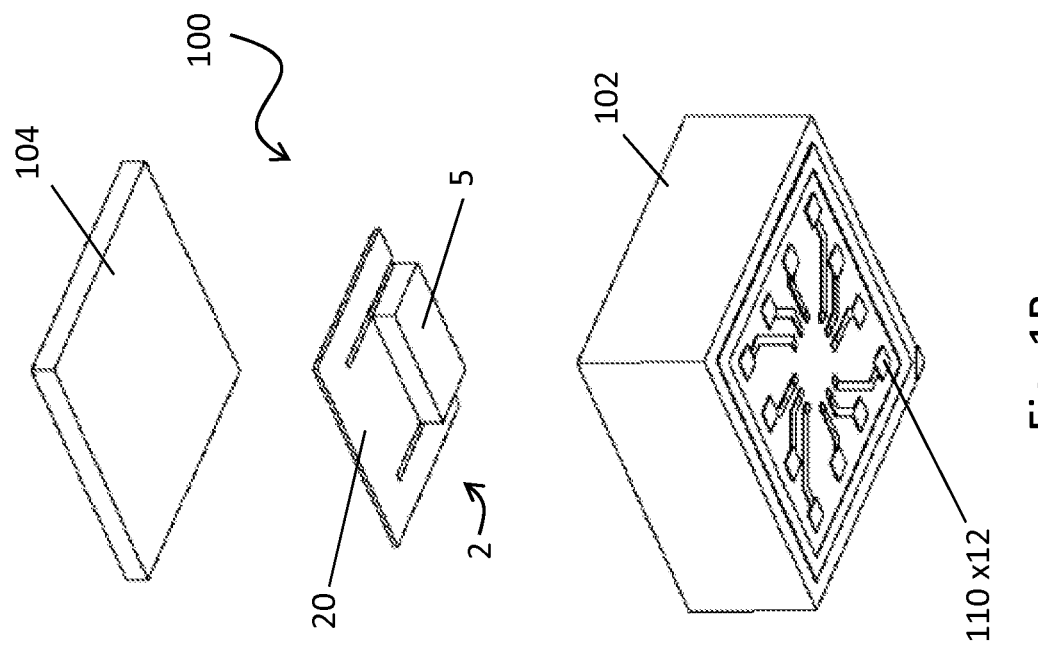
FIG. 1B illustrates an exploded view of the energy harvesting unit of FIG. 1A at a slightly different angle.

The embodiments disclosed herein relate to an energy harvesting unit configured to harvest energy when in vibration, methods related thereto, and systems employing such apparatuses or methods. The embodiments described use a piezoelectric device to convert kinetic energy into electrical energy for powering electronic systems. In one embodiment, the piezoelectric device comprises: a piezoelectric member configured to produce electricity when mechanically deformed or moved, a base and a lid configured to be fixed together and provide a sealed package for the piezoelectric member; with the base comprising through-hole vias ending with assembly pads, and cavities which accommodate the piezoelectric member. In a preferred embodiment, inner assembly pads will provide mechanical and electrical connections for the piezoelectric member inside the package. Also in a preferred embodiment, the outer assembly pads will provide electrical connection points for the piezoelectric member's electrodes from outside the package and mechanical anchor points for the package itself.

The embodiments described herein may be used in a wide variety of applications. In a preferred embodiment, the piezoelectric devices may be used for powering wireless sensing systems, providing a wireless sensor node based on energy harvesting techniques, which mitigates the reliance on batteries. In some embodiments, the piezoelectric devices may completely eliminate the use of batteries.

The devices described herein and the systems employing those devices are able to convert energy "freely" available in the environment, due to an object already vibrating, into electrical energy, store it, and use it for self-powering or other purposes. In some embodiments designed to work as a sensor, the sensor may be able to measure different physical quantities such as temperature, pressure or acceleration and send the data through a radio link.

The embodiments disclosed herein may harvest any kinetic energy "freely" available in the environment. For example, the embodiments disclosed herein may harvest kinetic energy due to an object already vibrating or in motion due to external forces. External forces may be created by natural forces such as wind, waves, human movement, excess mechanical energy from the industrial machinery, excitation of mechanical parts of buildings and infrastructures, or means of transportation such as vehicles, trains, aircrafts or helicopters just to name a few.

In a preferred embodiment, the energy harvesting devices may be provided in a sealed package. A sealed package may be any package that surrounds the piezoelectric member. In a preferred embodiment, the sealed package completely encases the piezoelectric member. Sealed packages may have any level of seal. A sealed package may simply surround the piezoelectric member or it may provide an air tight, water tight, dust tight or any other level of seal around the piezoelectric member. Embodiments provided in sealed packages may be ready-to-use, easy to handle and connect, and robust. Providing a sealed package may reduce the effort required for incorporating the energy harvesting device in an electronic assembly. For example, a sealed package may make connection with the electronic devices which need to be powered, easier. Moreover, the sealed package enables the use of the embodiments in harsh environments. Harsh environments may include environments where there is a high pressure and/or high humidity and/or high/low temperature.

Figure 1A:
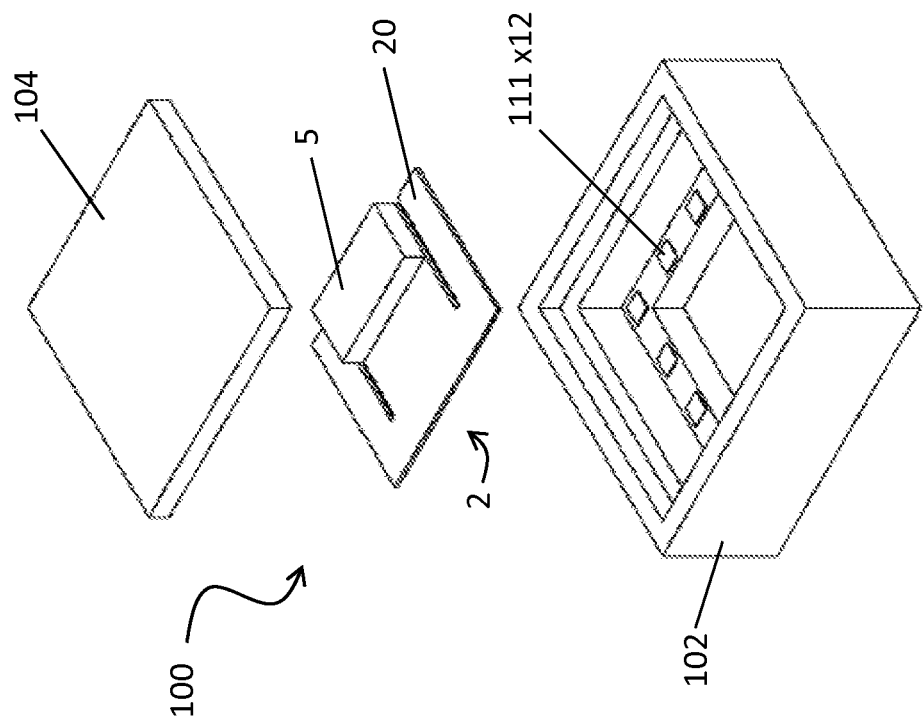
FIG. 1A illustrates an exploded view of an energy harvesting unit including a base, a lid and a piezoelectric member.

FIGS. 1A and 1B illustrate isometric exploded views of an energy harvesting unit in a sealed package. As may be seen in FIGS. 1A and 1B, some embodiments of the piezoelectric member may be packaged into a Printed Circuit Board (PCB) package, fabricated using fiberglass-reinforced epoxy laminate technology (e.g. FR4). The sealed package may reduce the risk of damage, and simplify the handling of the piezoelectric member.

The energy harvesting unit 100 of FIG. 1 is configured to harvest energy when in vibration and comprises: a piezoelectric member 2 configured to produce electricity when mechanically deformed or moved; a base 102; and a lid 104. In the embodiment shown in FIGS. 1A and 1B, the lid 104 may be configured to be fixed to the base 102 and provide a sealed package for the piezoelectric member 2. In the embodiment shown in FIG. 1, a lid 104 and a base 102 are used, however, other configurations of a sealed package are possible. For example, the sealed package could be comprised of two halves, more than two pieces, or various other configurations as long as a sealed package is formed around the piezoelectric device 2. The outline of the package may take a form of a square, rectangle or a circle, but is not limited to the listed shapes.

The base 102 and lid 104 may be made out of any suitable material. In a preferred embodiment, the base 102 and lid 104 are made out of plastic. In some embodiments, low-temperature co-fired ceramic (LTCC), high-temperature co-fired ceramic (HTCC), polymer, silicon or glass may be used as materials for the package. IC packaging, injection molding, laser cutting, sand blasting or milling technologies may be used for manufacturing of the package.

In a preferred embodiment, the base 102 comprises through-hole vias ending with assembly pads 110. The assembly pads may also be referred to as electrical contacts Inner assembly pads—electrical contacts—111 may provide mechanical connection of the piezoelectric member inside the package. In yet other embodiments, wires may be passed through the package. Also in the preferred embodiment, the base 102 has a cavity or cavities, which accommodate the piezoelectric member. In the embodiment shown in FIG. 1, inner assembly pads 111 provide mechanical and electrical connection of the piezoelectric member 2 inside the package. The outer assembly pads 110 provide electrical connection of the piezoelectric member's electrodes from outside the package and mechanical anchor points for the package itself. Although the package is shown with outer assembly pads 110 on the bottom, other forms of connections may be used including a flip chip or a leadless chip carrier (LCC).

In use, the energy harvesting unit 100 can easily be placed on an object to harvest energy from the vibration of the object. The vibration of the object will result in a deformation or movement of the piezoelectric member 2, which will produce an output electric power due to the piezoelectric effect. In a preferred embodiment, the electric energy produced by the embodiments disclosed herein may be used for powering electronic systems, in particular, low power electronic systems. In other embodiments, the devices may be used to store energy for a backup system or provide power as a backup system. In yet other embodiments, the embodiments may be used to provide supplemental power.

In a preferred implementation, an embodiment of an energy harvesting device 100 may be used to power a wireless sensing system. In some embodiments, the energy harvesting device 100 may provide enough power to create a complete autonomous wireless sensor node. In some embodiments, the energy harvesting device 100 or plurality of devices may provide enough energy to an autonomous wireless sensor node to completely eliminate the use of batteries.

In general, energy harvesting techniques allow transforming low grade energy into usable electrical energy. In some embodiments, enough energy may be created to enable an autonomous, self-powered, battery-free, wireless, maintenance-free operation, long life-time, electronic device.

One advantage of an autonomous wireless sensor node is the possibility to monitor systems and physical quantities in harsh and/or sealed and/or not easily accessible locations, where wired and battery based sensing systems cannot be employed. Moreover, even in locations where wired and battery based sensing systems can be employed, they are limited by cabling cost or the limited lifetime of the batteries. In particular, in battery based systems, replacing or recharging batteries can be costly and time consuming. Moreover the weight and volume of the batteries are shortcomings. Thus, the use of an autonomous wireless sensor node will simplify the deployment of the sensing system and reduce the maintenance and cost.

In a preferred embodiment, the kinetic energy harvested may be in the form of harmonic vibration, non-harmonic vibration, rotation, displacement, torque, acceleration or acoustic wave. Typical operating frequencies from these motions are in the range of 1 Hz to 50000 Hz. However, any frequency may be supported by modifying the design of the energy harvesting device.

Figure 2A:
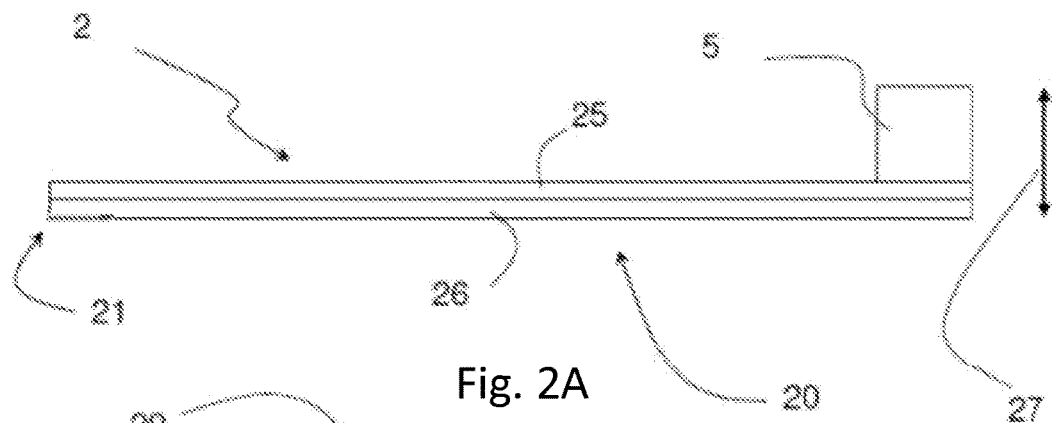
FIG. 2A illustrates a side view of a bimorph piezoelectric member including a proof mass.
Figure 2B:
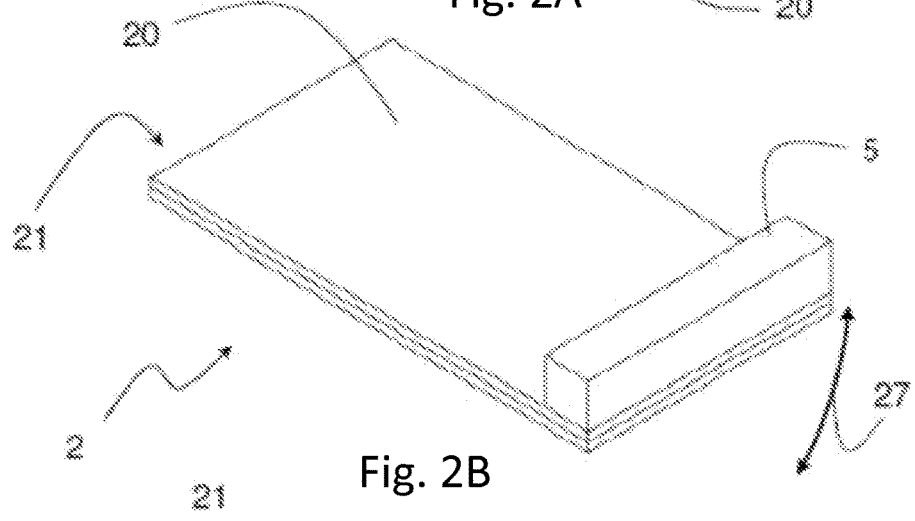
FIG. 2B illustrates an isometric view of the bimorph piezoelectric member including a proof mass of FIG. 2A.
Figure 2C:
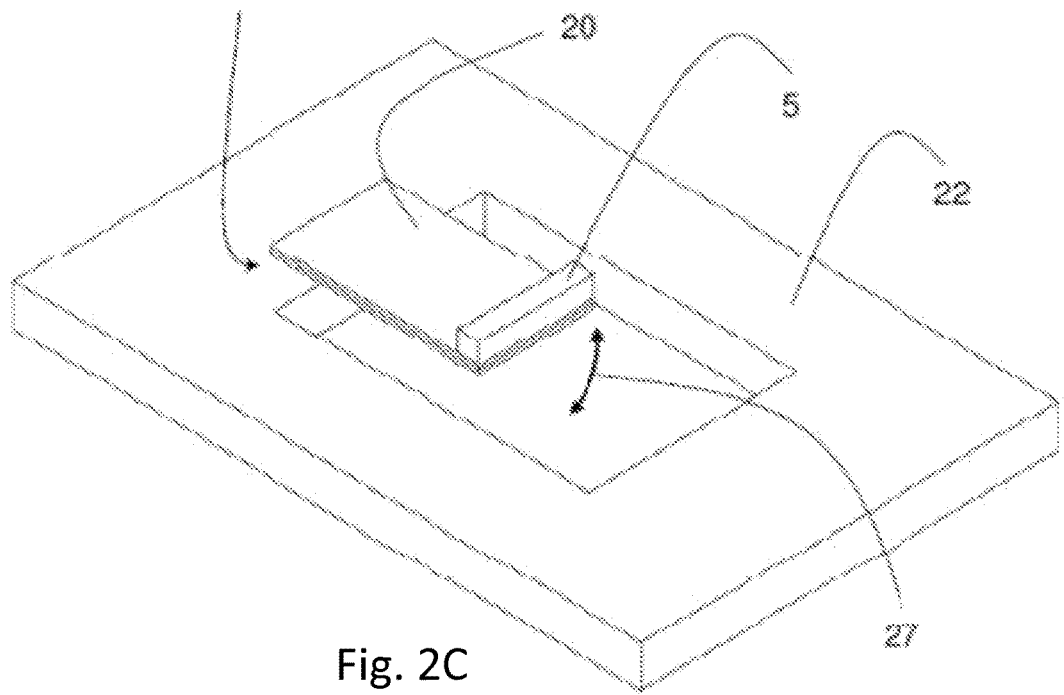
FIG. 2C illustrates an isometric view of the bimorph piezoelectric member including a proof mass of FIG. 2A surrounded by a frame.

FIGS. 2A-2C illustrate one embodiment of a piezoelectric member 2. In a preferred embodiment, the piezoelectric member 2 is made of a piezoelectric material such as lead zirconate titanate (PZT). PZT is a preferred choice because it has good energy harvesting properties (high coupling coefficient $k_{31}$ and high value of $d_{31} \cdot g_{31}$) and a relatively low cost. In preferred embodiments $|k_{31}|>0.3$ and $d_{31} \times g_{31} > 1.2e-15$ [C/N×Vm/N].

In other embodiments, alternative piezoelectric materials such as, but not limited to, single crystals lead magnesium niobate-lead titanate (PMN-PT), potassium sodium niobate (KNN), aluminium nitride (AlN), polyvinylidene fluoride (PVDF) or quartz can be used for the piezoelectric member.

In various different embodiments, the energy harvesting device may be designed in many different ways. In one or more embodiments, the piezoelectric member may be a single clamped rectangular cantilever 20 attached or anchored at one end 21 as shown in FIGS. 2A-2C. The opposite end of the cantilever is free to move up and down 27. In other embodiments, the shape of the cantilever may be, but is not limited to, triangular or trapezoidal.

The dimensions of the cantilever may vary in the range from 2 mm×2 mm to 100 mm×100 mm. Different dimensions may be used depending on the frequency of vibration expected to be experienced.

In a preferred embodiment, the cantilever beam 20 may be a bimorph beam, i.e. comprising two active piezoelectric layers 25 and 26. However, a unimorph beam, with one active piezoelectric layer and another passive support layer of inactive PZT or other material, may also be used. In some embodiments, a multilayer structure (having more than two piezoelectric layers) for the cantilever beam may be used.

Figure 3A:
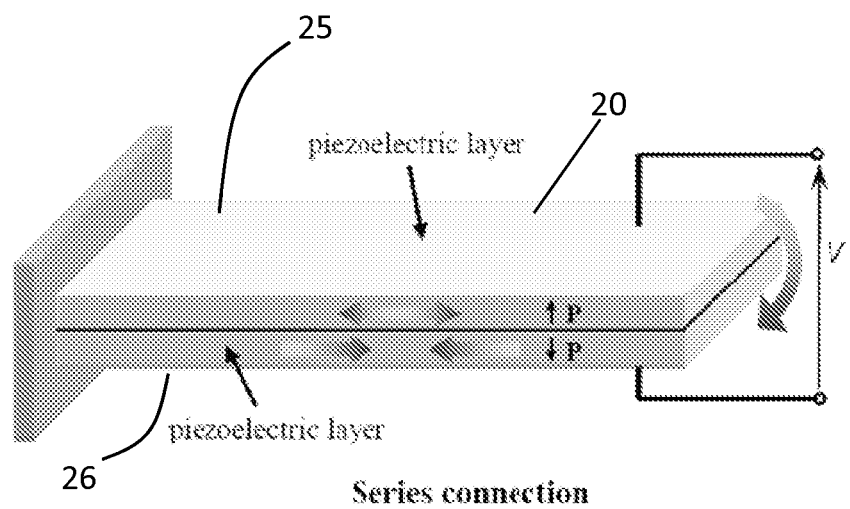
FIG. 3A illustrates an isometric view of a cantilevered bimorph piezoelectric member fixed at one end with the layers of the piezoelectric member electrically connected in series.
Figure 3B:
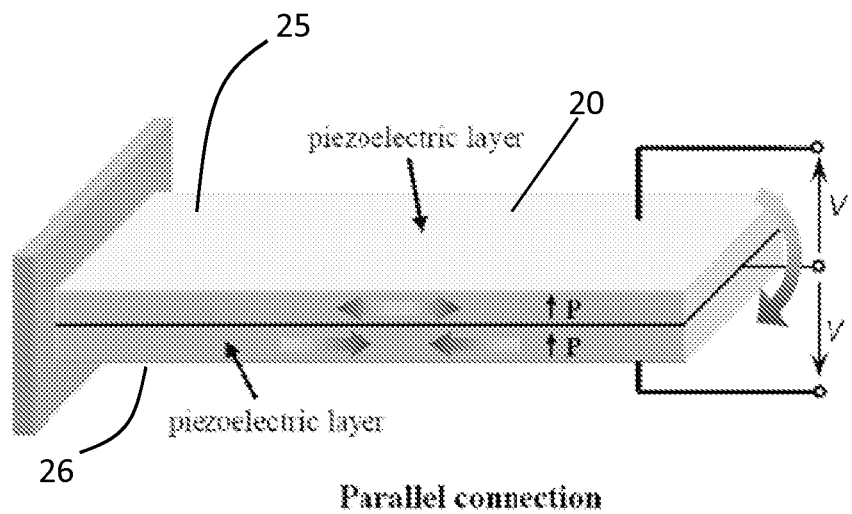
FIG. 3B illustrates an isometric view of a cantilevered bimorph piezoelectric member fixed at one end with the layers of the piezoelectric member electrically connected in parallel.

In one or more embodiments, each active piezoelectric layer has a top and a bottom electrode, which enables the collection of the charge generated by piezoelectric effect of each piezoelectric layer 25 and 26. As may be seen in FIG. 3A, electrodes may be placed on both the top and bottom of each piezoelectric layer 25 and 26. As may be seen by contrasting FIGS. 3A and 3B, when multiple layers 25 and 26 are used for the piezoelectric member 2, different electrical configurations may be used. In some embodiments, the bimorph beam 20 has the piezoelectric layers 25 and 26 poled in opposite directions, while the piezoelectric layers are electrically connected in series, as shown in FIG. 3A. In alternative embodiments, the bimorph beam 20 may have the piezoelectric layers 25 and 26 poled in the same direction, while the piezoelectric layers are electrically connected in parallel, as shown in FIG. 3B.

In one or more embodiments, the electrodes of the piezoelectric member may be patterned by physical, chemical etching or by deposition. In a preferred implementation, the pattern of the electrodes may be optimized, for example by removing partially the electrodes in inactive (low strain) areas of the piezoelectric member close to the free end, in order to reduce the parasitic capacitance of the device.

As may be seen by returning to FIG. 2A-2C, in some embodiments, one or more proof masses 5 may be coupled to the free end of the cantilever beam 20, thus increasing the deformation of the piezoelectric member and therefore, the energy conversion. The proof mass 5 may also be used to decrease the resonance frequency of the piezoelectric member, for a specific geometry of the beam. In particular, the use of a cantilever where the ratio between mass length and cantilever length is 50% will provide the lowest resonance frequency, while a ratio of 70% will maximize the output power. The "cantilever length" is the length of the cantilever including the length of the proof mass along the cantilever direction; "mass length" is the length of the proof mass along the cantilever direction. For example, in FIGS. 9B and 9D, the cantilever length are the same 6 mm, the mass length in FIG. 9B is 0 (no mass), the mass length in FIG. 9D is 3 mm, which results in a 50% ratio between mass length and cantilever length. The material used for the proof mass may be, but is not limited to, PZT, alumina, tungsten, iron, copper or nickel.

The proof mass 5 may be coupled to the surface of the piezoelectric member in various different ways. For example, the proof mass 5 may be glued, soldered, deposited on the piezoelectric member's surface by screen-printing, electroplating, electrodeposition, additive printing or dispensed in a fluid form. The various different methods of coupling the proof mass 5, enables a flexible and custom design of the proof mass and the choice of its material.

Figure 4:
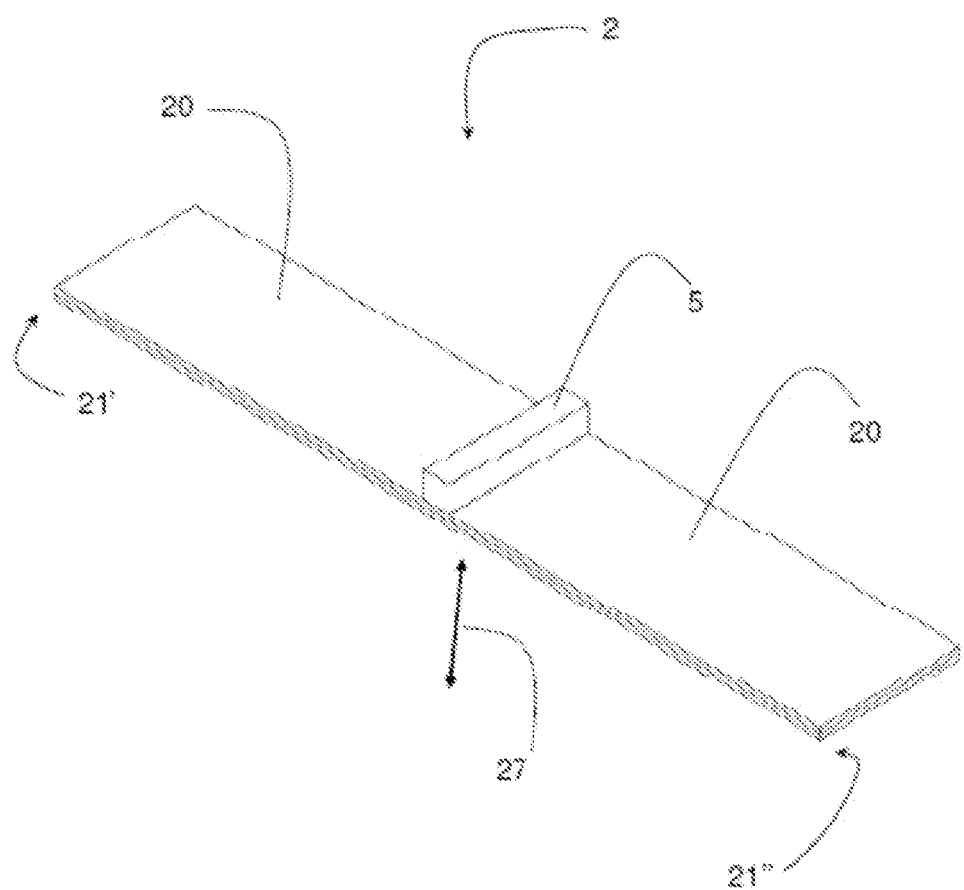
FIG. 4 illustrates an isometric view of a bimorph piezoelectric member designed to be fixed at both ends.

As may be seen in FIG. 4, in some embodiments, the cantilever 20 may be anchored to a body at the two opposite ends 21' and 21", creating a bridge structure. In embodiments incorporating a bridge structure, the proof mass 5 may be placed on a point along the cantilever length.

Figure 5A:
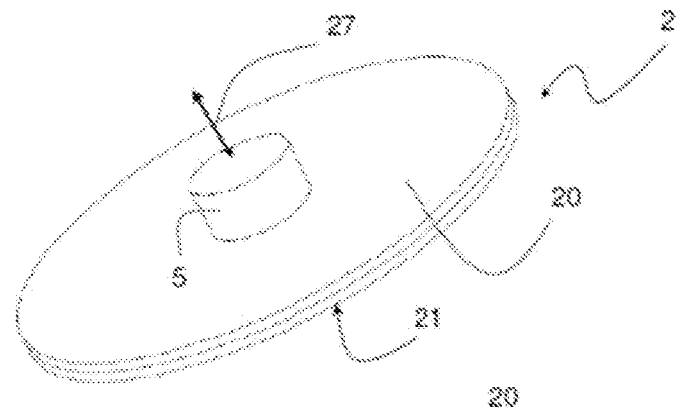
FIG. 5A illustrates an isometric view of a bimorph piezoelectric member designed to be fixed at its periphery.
Figure 5B:
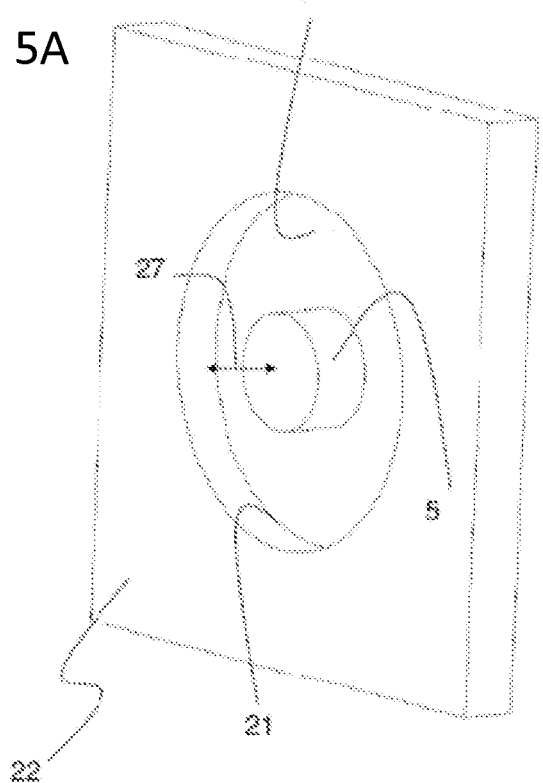
FIG. 5B illustrates an isometric view of the bimorph piezoelectric member of FIG. 5A mounted in a frame.

As may be seen in FIG. 5, in yet other embodiments, the piezoelectric member 2 may be a membrane anchored to a body 22 at the periphery 21. In a preferred embodiment incorporating a membrane 20 anchored to a body 22 at the periphery 21, the proof mass 5 may be located close to the center. However, in other embodiments, the proof mass 5 may be located in other positions.

The piezoelectric member may be manufactured using various methods. In a preferred embodiment, the piezoelectric member is manufactured with tape casting technology. Tape casting allows stacking several piezoelectric ceramic layers together. Custom shape electrodes may be added using deposition techniques such as screen-printing. Multilayer technologies enable the manufacture of multilayer devices by allowing the creation of large-area ceramic or functional layers that are relatively thin compared to their area. Tape casting technology creates layers by stacking several piezoelectric tapes. The thickness of the layers may range from 1 μm to 1 mm. Once the layers are stacked, the layers may then be laminated and sintered together, creating multilayer structures.

Screen-printing technology enables deposition and integration of piezoelectric layers, metal layers, dielectric layers, resistive layers or other functional material layers on miniaturized devices. Screen-printing is capable of achieving high lateral resolution, high integration, low prototyping costs, high volume production and wide range of compatible substrates.

The piezoelectric member may operate at any frequency and may be influenced by vibrations at various different frequencies. In a preferred embodiment, the piezoelectric member is designed such that it has a resonant frequency that matches the vibrations it will experience. Designing the piezoelectric member to have a resonant frequency that matches the environment it will exist in, allows even small vibrations to produce large amplitude oscillations. Such a design makes the piezoelectric member more efficient and allows it to maximize the output power. Tuning the resonance frequency of the piezoelectric member 2 may be achieved by properly designing its geometrical dimensions and/or adjusting the position and/or size of the proof mass 5. Tuning may be performed by adding or removing material from the proof mass 5 or piezoelectric member 2. Material may be added using any number of techniques including but not limited to screen-printing, electroplating, electrodeposition, additive printing or dispensing in a fluid form. Material may be removed by various techniques including but not limited to laser blasting or micromachining Although in a preferred embodiment, the piezoelectric member is designed to have one or more resonant frequencies that align with the expected environment, other embodiments may be designed without considering the resonant frequencies or environment. Although they may not be as efficient, the embodiments disclosed herein can work when not excited at the resonance frequency. From the perspective of operation of the electronic system powered by energy harvesting unit 100, one of the most important design considerations is ensuring the energy level is sufficient to power the electronic system. So if the level of delivered power is high enough to power the system, it is more beneficial to broaden the bandwidth of a harvester, having a piezoelectric member with a low mechanical quality factor (Q-factor), in order to e.g. account for frequency drift of either the source or the harvester. In order to compensate the loss in power output due to a low Q-factor, the use of highly sensitive piezoelectric material/component, increased proof mass and proper embodiment design is preferable. Q-factor is a dimensionless parameter that describes how underdamped an oscillator or resonator is, or equivalently, characterizes a resonator's bandwidth relative to its center frequency.

Soft PZT materials may be used for the piezoelectric member 2, such as Navy type II (e.g. Ferroperm Pz27 or PZT-5A), are preferable to obtain a low Q-factor, however, other PZT materials may be used. Q-factors below 200 are preferable. In an even more preferable embodiment, the Q-factor is below 150 and even more preferably below 100. One advantage of a relatively low Q-factor is an increase in the usable frequency bandwidth (e.g. higher than 3%). Another advantage of a low Q-factor is that it provides less constraint on the accuracy of the resonance frequency of the piezoelectric member, simplifying or avoiding the tuning and the matching to the source frequency, thus resulting in simplified manufacturing process and reduced production costs.

Another advantage of lowering the Q-factor, and thus widening the response bandwidth, is the ability for the embodiments to be used in applications where the vibration frequencies change over time or the vibrations contain more than one harmonic component (broad spectrum). Yet another advantage of lowering the Q-factor is an increase in the reliability of the piezoelectric member. In fact, a high quality factor contributes to a higher deflection which increases the chance of breaking the piezoelectric member. Furthermore, a low Q-factor allows much higher source acceleration, which can be above 10 g. This not only allows the system to survive in more environments, but allows the system to work much further away from the resonance, even outside the defined bandwidth of the energy harvesters. This is because at high acceleration, just a small percentage of the peak power may be enough to power a sensor system.

Figure 6:
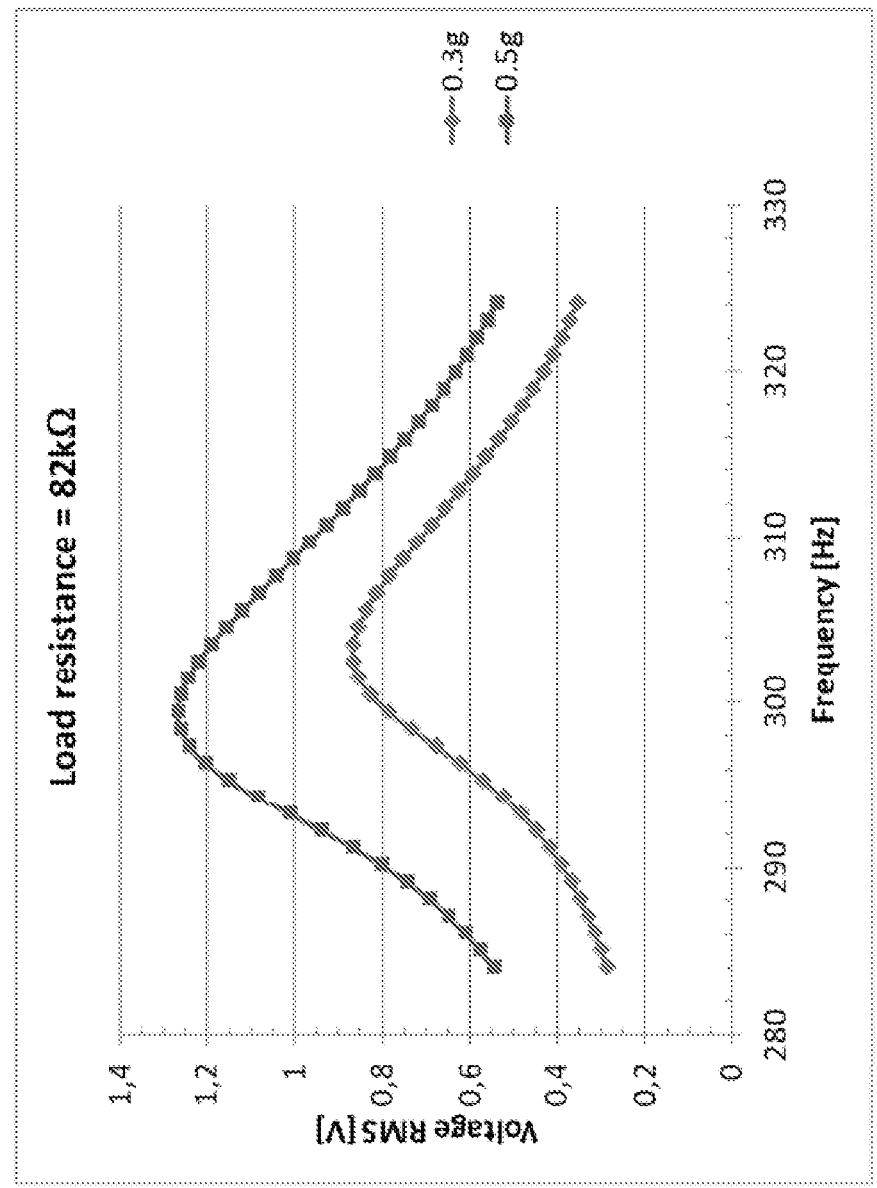
FIG. 6 illustrates the root mean square (RMS) voltage of an energy harvesting unit with a matched load.
Figure 7:
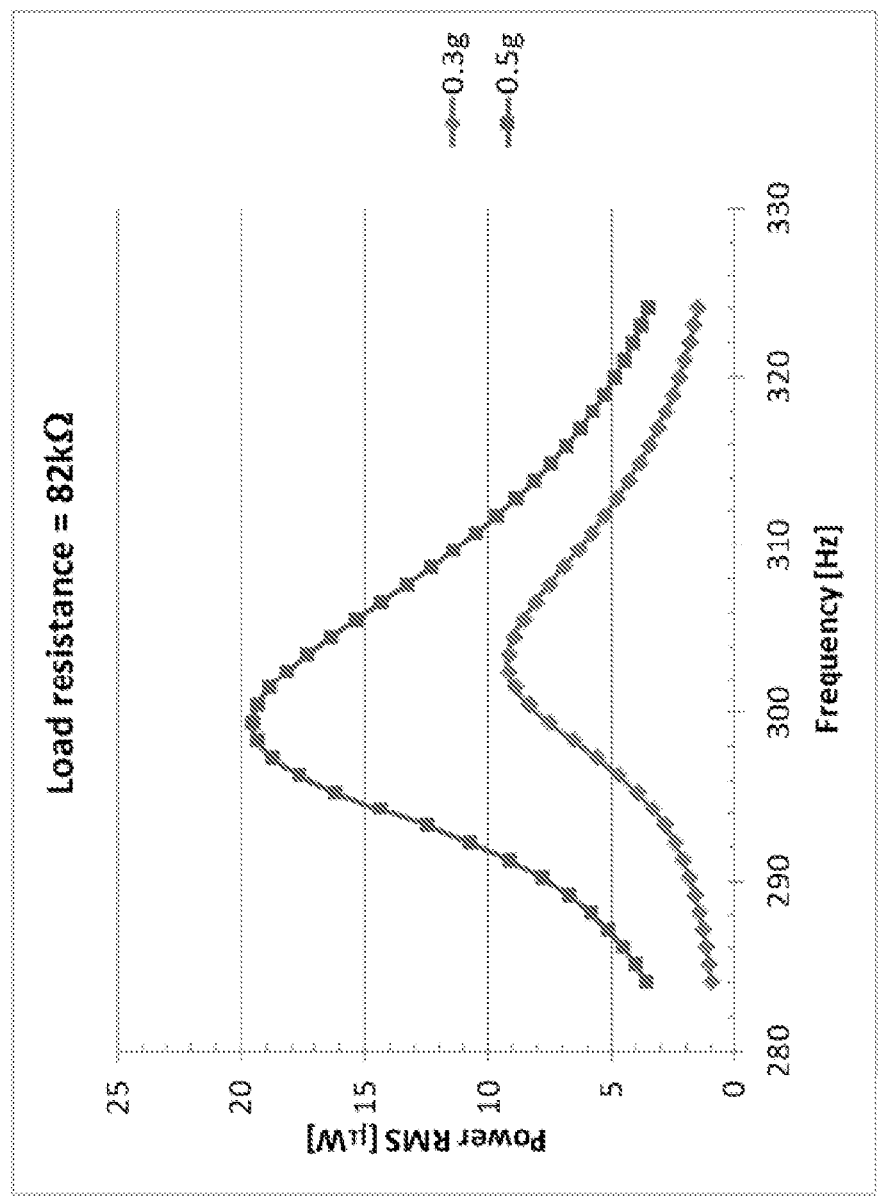
FIG. 7 illustrates the RMS power of an energy harvesting unit with a matched load.
Figure 8:
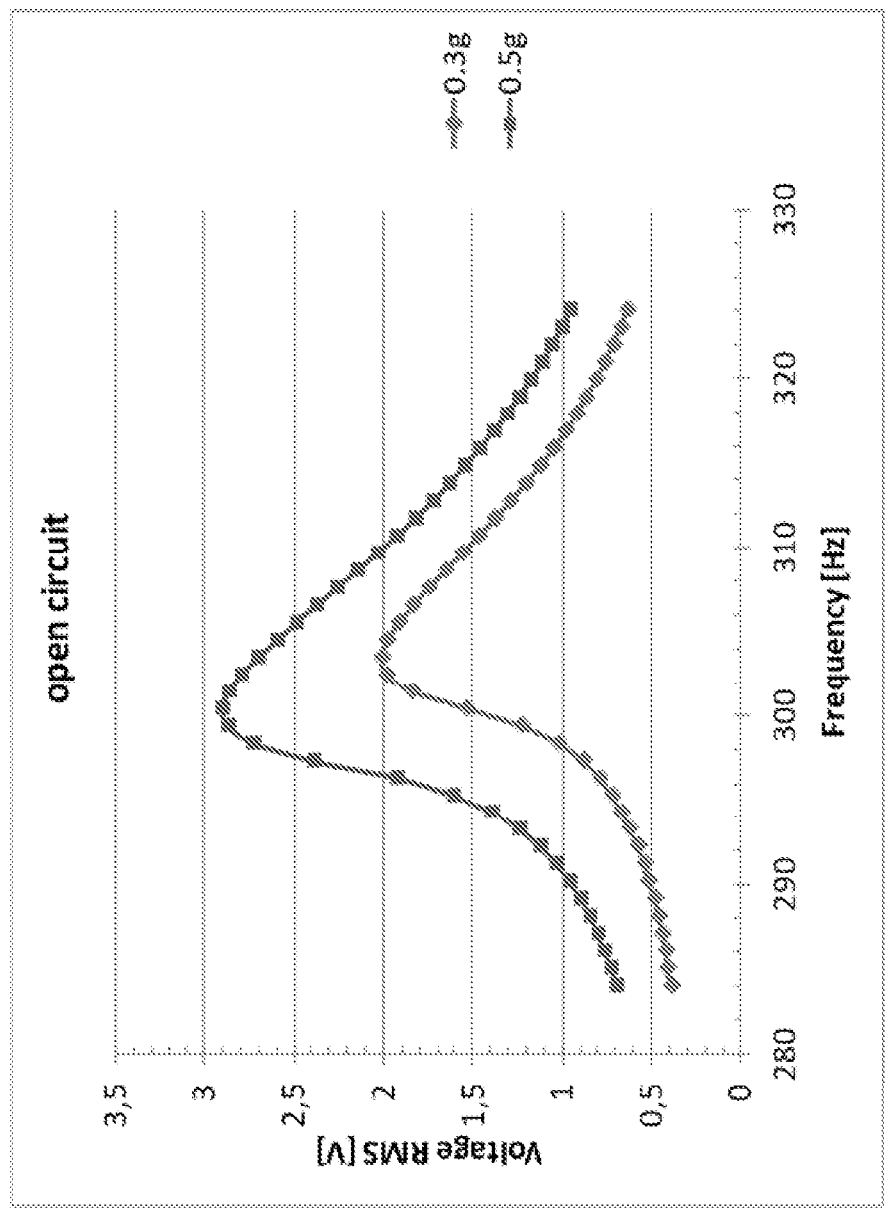
FIG. 8 illustrates the RMS open circuit voltage of an energy harvesting unit.

FIGS. 6, 7, and 8 illustrate typical performances of embodiments of fully packaged vibration energy harvesting units. FIG. 6 illustrates the root mean square (RMS) voltage of an energy harvesting unit with a matched load. FIG. 7 illustrates the RMS power of an energy harvesting unit with a matched load. FIG. 8 illustrates the RMS open circuit voltage of an energy harvesting unit. As may be seen in FIG. 8, the full width of the bandwidth at half maximum can be deduced to 5-6% at 0.3 g and 6-8% at 0.5 g.

In other embodiments, the piezoelectric member 2 may be realized using Micro ElectroMechanical Systems (MEMS) technology, thick film technology, thin film technology, laminated PVDF films or laminated piezoelectric ceramic layers.

FIGS. 9A through 9D illustrate embodiments of a piezoelectric member 2 including an outer frame structure 210. The outer frame structure 210 may be used as an anchor structure for attaching the piezoelectric member. Having an outer frame structure 210 simplifies the handling of the piezoelectric member and the packaging process by keeping the piezoelectric member in place, providing well defined anchor points, and maintaining a well-defined cantilever length.

Figure 9A:
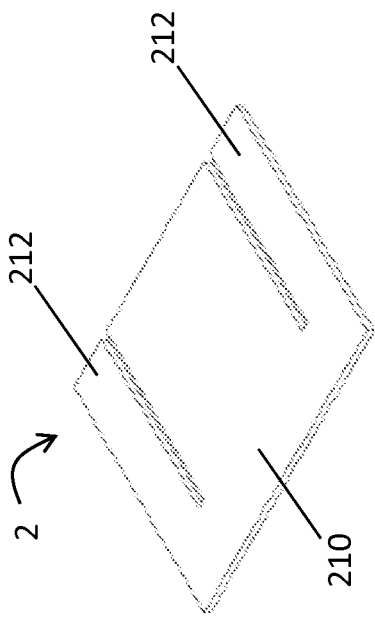
FIG. 9A, illustrates an isometric view of an embodiment of a cantilevered piezoelectric member with a frame structure surrounding the whole cantilever.
Figure 9B:
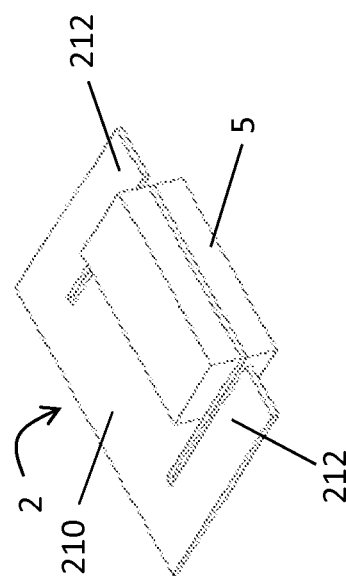
FIG. 9B, illustrates an isometric view of an embodiment of a cantilevered piezoelectric member with an outer frame structure that borders the cantilever on three sides.
Figure 9C:
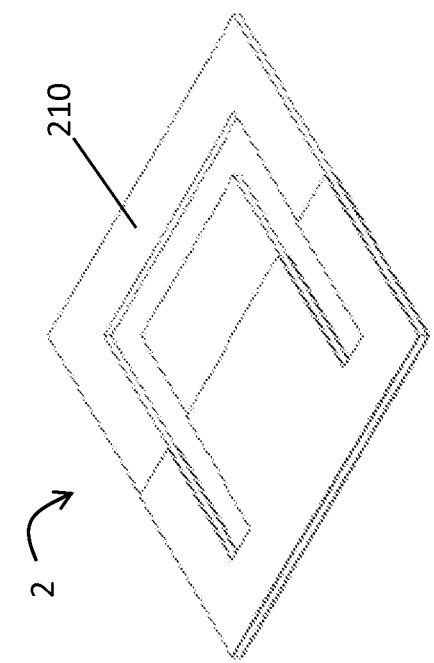
FIG. 9C, illustrates an isometric view of an embodiment of a cantilevered piezoelectric member with an outer frame structure that borders the cantilever on three sides.
Figure 9D:
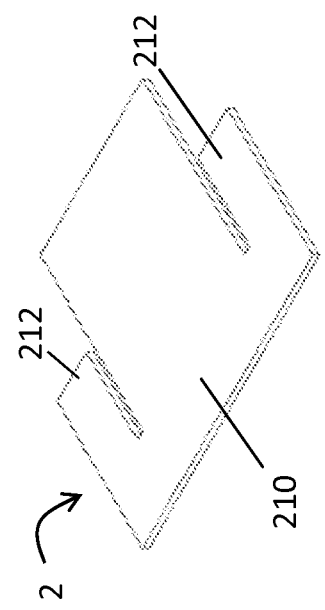
FIG. 9D, illustrates an isometric view of an embodiment of a cantilevered piezoelectric member with an outer frame structure that borders the cantilever on three sides and a proof mass coupled to both the top and bottom of the cantilever.
Figure 10A:
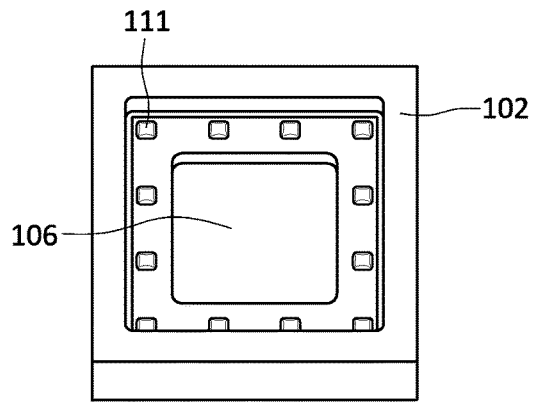
FIG. 10A illustrates an isometric view of an embodiment of a base with a cavity and inner pads surrounding the cavity.
Figure 10B:
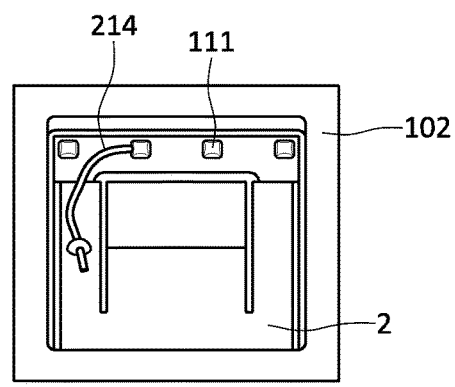
FIG. 10B illustrates the base of FIG. 10A with a piezoelectric member coupled above the cavity and a wire connecting the top electrode to one of the inner pads.
Figure 10C:
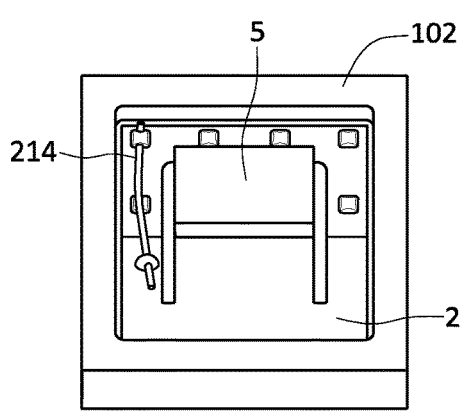
FIG. 10C illustrates an isometric view of the embodiment of FIG. 10B.
Figure 10D:
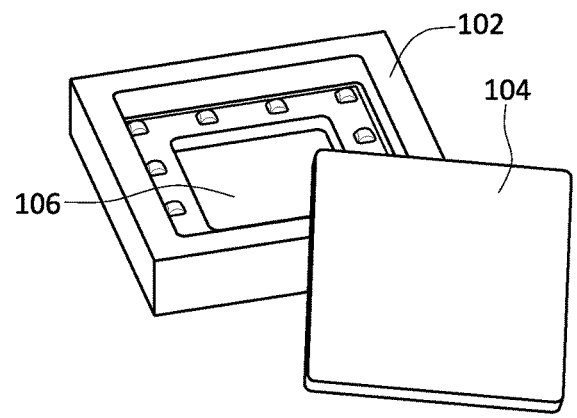
FIG. 10D illustrates an isometric view of the embodiment of FIG. 10A further including a lid.
Figure 10E:
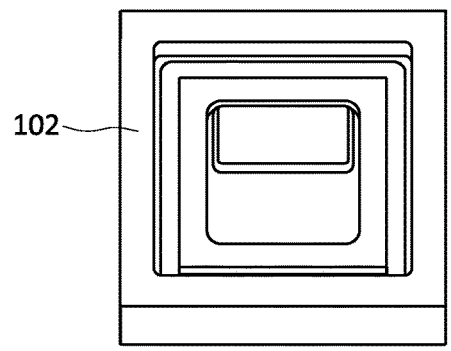
FIG. 10E illustrates the embodiment of FIG. 10C with a MEMS energy harvester.
Figure 11:
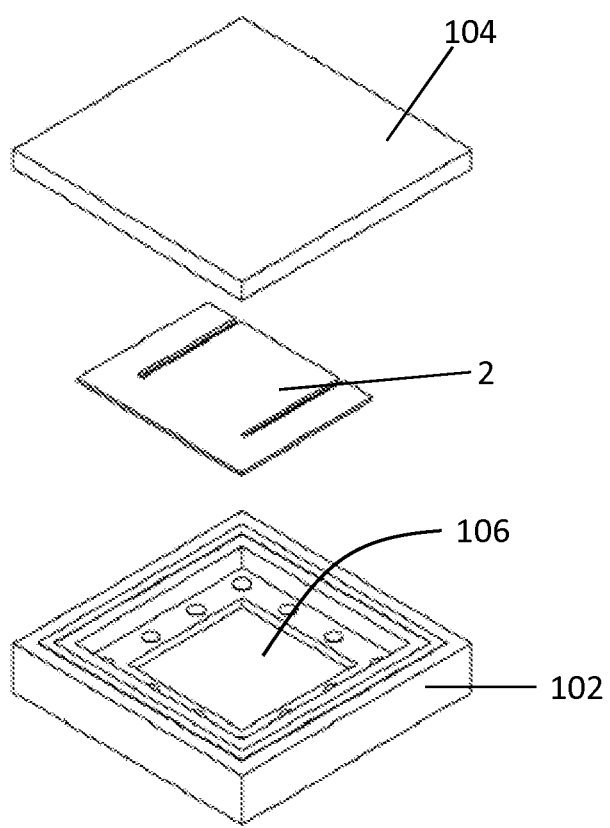
FIG. 11 is an exploded isometric view of an embodiment of an energy harvesting unit including a base with a cavity.

As may be seen in FIG. 9A, in some embodiments, the frame structure 210 may surround the whole cantilever. In the embodiment shown in FIG. 9A, a square frame is used; however, any other shape may be used. In addition, the cantilever may be a different shape from the frame 210. In the embodiments shown in FIGS. 9B and 9C, the outer frame 210 borders the cantilever on three sides. The portions of the outer frame 210 that border the sides adjacent to the anchored end may be called lateral arms 212. The manufacturing process of the piezoelectric member with lateral arms 212 is easier than a squared frame embodiment because it may be realized by saw dicing two grooves along the sides of the cantilever.

When the embodiments, such as those disclosed in FIG. 9A-9D, are manufactured, they may be mass produced. For example, the frame structure and the cantilever may be patterned by means of laser cutting. As may be seen in FIG. 9D, a proof mass 5 may be added to one or both sides of the cantilever.

Returning to FIG. 1, an embodiment with inner assembly pads 111 is illustrated. In some embodiments, the piezoelectric member 2 is attached or anchored to the package and the inner assembly pads 111 by soldering, providing both mechanical anchoring of the structure and electrical connection of the bottom electrode to the assembly pads 111. In some embodiments, glue may be applied to further enhance the mechanical stability.

In embodiments that use a bimorph piezoelectric member, the top electrode must also be connected. As may be seen in FIG. 10, in one or more embodiments, the top electrode of the piezoelectric member is electrically connected to the inner assembly pads 111 by soldering a conductive wire 214 between the top electrode and the inner assembly pad(s) 111.

In other embodiments, the piezoelectric member may be attached to the package by gluing, eutectic bonding or bracing, while the electrodes may be wire bonded to the assembly pads. The base 102 and the lid(s) 104 may also be fixed together by gluing or soldering or bracing. Generally speaking, any method of coupling the base 102 to the lid 104 may be used.

Cavities 106 may be added somewhere to the interior of the piezoelectric assembly in order to accommodate the moving piezoelectric member 2 and the proof mass 5. In some embodiments, either the base 102 or the lid 104, or both the base 102 and the lid 104, may have one or more internal cavities 106 of different dimensions, which will accommodate the piezoelectric member 2 and the moving proof mass 5. The configuration of the base 102 and the lid 104, and the arrangement of the cavities 106 may be changed and optimized according to the actual implementation.

FIGS. 10A-10E and FIG. 11 illustrate an embodiment with cavities 106 only inside the base 102 and not inside the lid 104. Embodiments with cavities only inside the base 102 may simplify the assembly of the package, while increasing the complexity of manufacturing cavities 106 and base 102. Embodiments with cavities 106 only inside the lid 104 may present opposite design challenges.

Figure 12A:
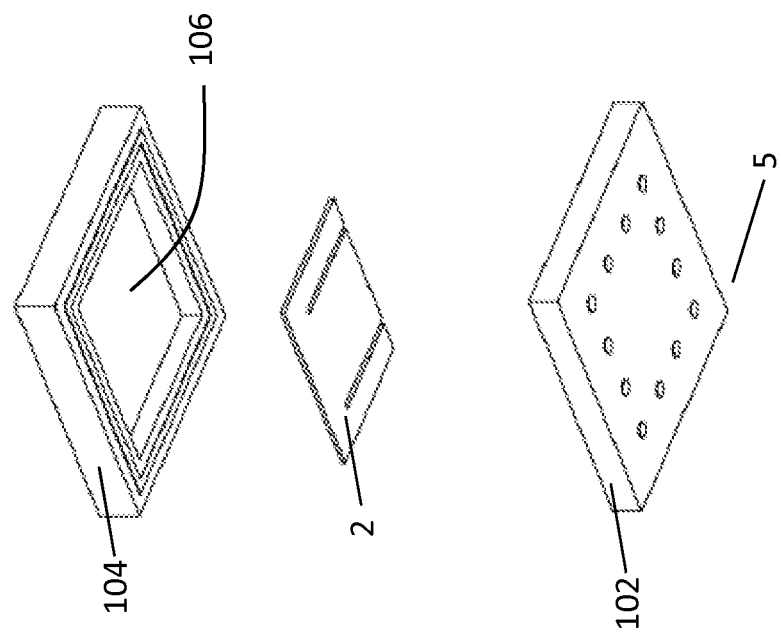
FIGS. 12A and 12B are exploded isometric views of an embodiment of an energy harvesting unit including both a base and a lid each with a cavity.
Figure 12B:
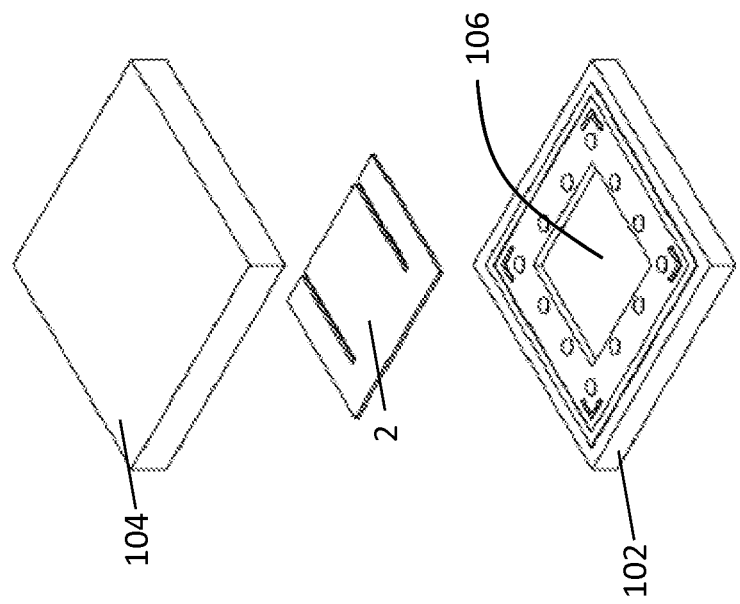

FIGS. 12A and 12B illustrate isometric views of an embodiment with a cavity 106 inside both the base 102 and the lid 104. Embodiments with at least one cavity 106 inside both the base 102 and the lid 104 simplifies the manufacturing of the base 102 and the lid 104, while potentially making the assembling process more complicated.

Figure 12C:
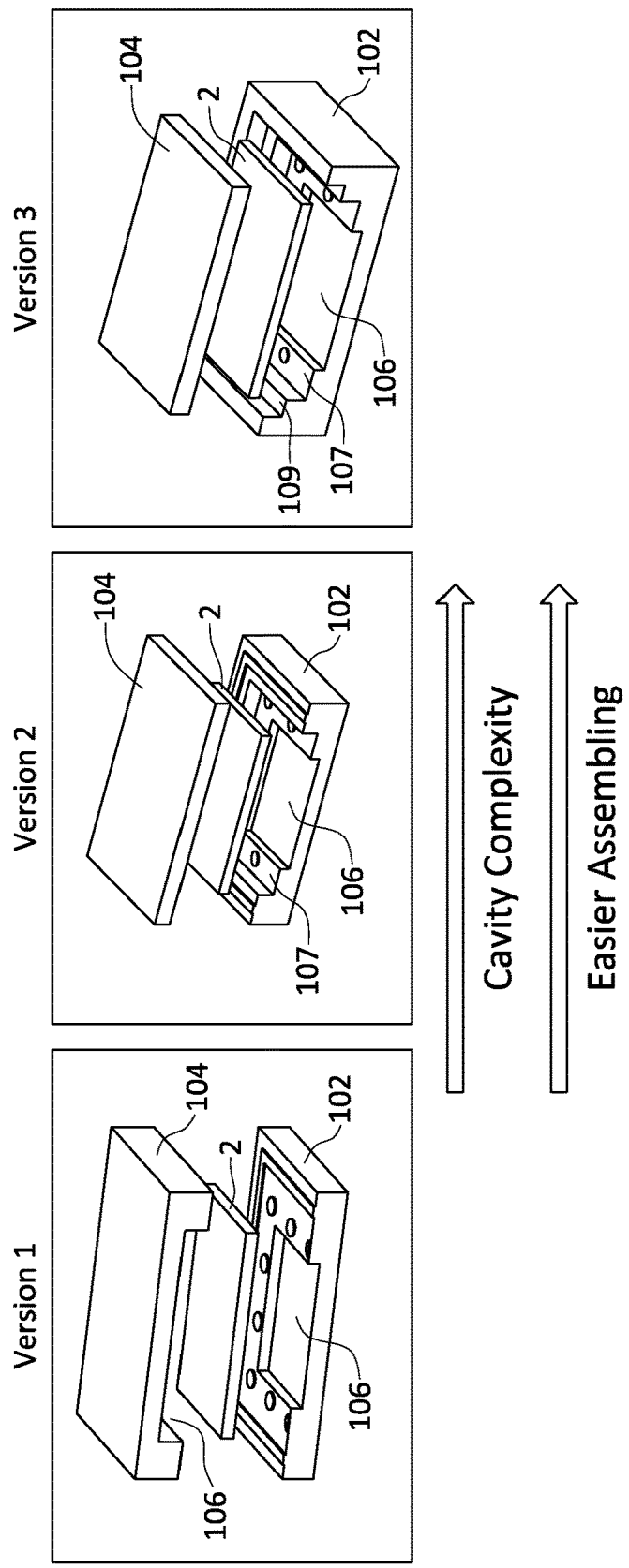
FIG. 12C illustrates the cavity complexity and easy of assembly for three versions of an energy harvester unit assembly including a lid, base, and piezoelectric member.

FIG. 12C illustrates the various different cavity designs of three different embodiments. As may be seen in version one of FIG. 12C, both the base 102 and the lid 104 include a cavity 106 to accommodate the motion of the energy harvester. As may be seen in version 1 of FIG. 12C, the internal pads 111 are located on the base flush with the top surface. A rectangular cavity, which is a rectangular recessed portion of the base, is cut into the base to allow movement of the proof mass. The cross section shown in version 1 of FIG. 12C shows that the cavity in this embodiment is a recess that is stepped down from the mating surface of the base. The lid 104 in version 1 of FIG. 12C has a similarly shaped cavity 106. When the lid 104 and the base 102 are coupled together the cavities of the two are combined to seal the energy harvester within the lid 104 and base 102 but allow the proof mass to move.

FIG. 12C version 2 illustrates an embodiment with only a cavity 106 in the base 102. In embodiments with only a cavity 106 in the base 102, the energy harvester needs to be recessed into the base 102 such that a clearance is provided with the lid 104 when the base 102 and the lid 104 are coupled together. Accordingly, a recessed ledge 107 is cut out of the base 102. The inner pads 111 are formed on the ledge 107. The cavity 106 is similar to the one shown in version 1 of FIG. 12C except in this embodiment the cavity 106 is further recessed from the ledge 107. The lid 104 is then coupled to the top surface of the base 104, while the energy harvester is coupled to the surface of the ledge 107.

Another embodiment with only a cavity 106 formed in the base 102 is shown in version 3 of FIG. 12C. The different between version 2 and version 3 in FIG. 12C is that in version 3, the lid 104 is assembled on a recessed ledge such that the top of the lid is flush with the top of the base 102. To this end, a first ledge 109 is cut into the base. The first ledge is designed to mate with the lid 104. A second ledge 107 is cut into the base recessed from the first ledge 109. The second ledge includes a plurality of inner pads 111 and is designed to mate with the energy harvester. A cavity 106 recessed from the second ledge 109 is also cut into the base 102. To this end, the sides of the base include a number of steps starting from the top of the base and stepping down to the first ledge 109, then stepping down to the second ledge 107 and finally stepping down to the cavity 106.

Figure 13:
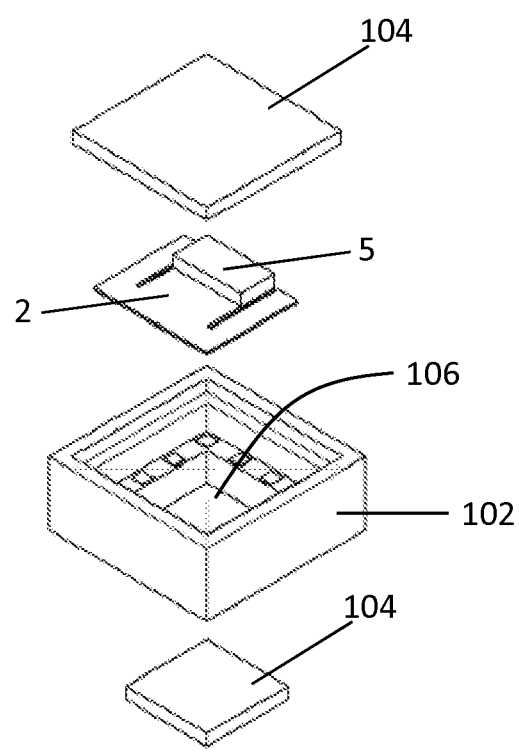
FIG. 13 illustrates an exploded isometric view of an embodiment of an energy harvesting unit including a base and two lids, one forming the bottom of the base.

FIG. 13 illustrates an embodiment with a cavity 106 in the base 102 and an additional lid 104 on the bottom side of the base 102. Embodiments that have a cavity 106 and an additional lid 104 on the bottom side of the base 102 provide a useful way to check the piezoelectric member 2 after it has been fixed.

Figure 14A:
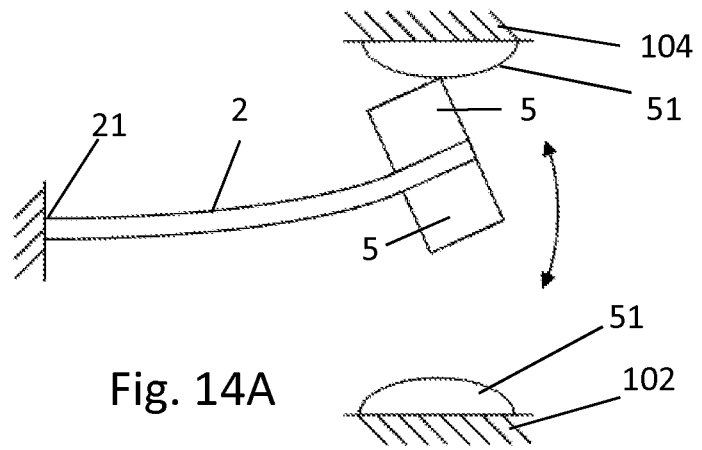
FIGS. 14A-14C illustrate embodiments of mechanical stops for a cantilevered piezoelectric member.
Figure 14B:
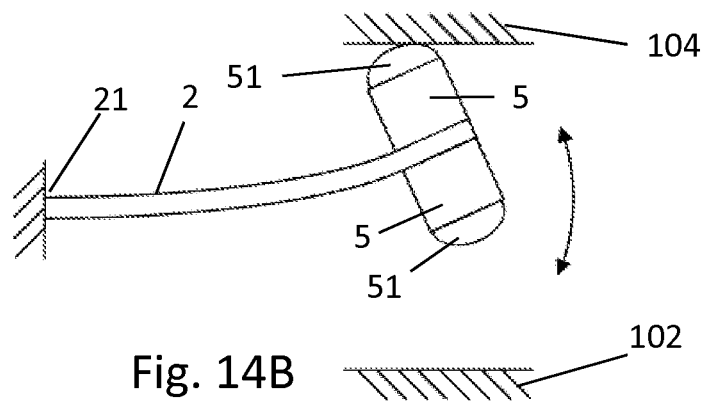
Figure 14C:
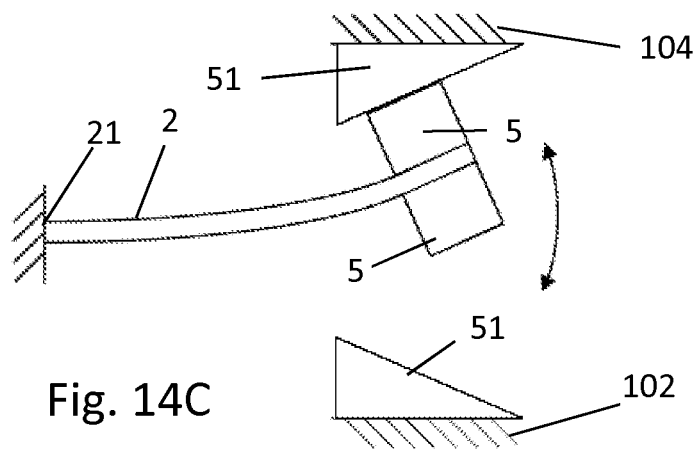

FIGS. 14A-14C illustrate various embodiments that include mechanical stops 51. In preferred embodiments, mechanical stops 51 may be used to limit the maximum deflection of the piezoelectric member 2. In some embodiments with mechanical stops 51, the mechanical stops 51 may be integrated with the cavity 106 to limit the maximum deflection of the piezoelectric member 2, thus reducing the possibility of damage the piezoelectric member 2.

In a preferred embodiment, the mechanical stops 51 may also be used as "bumpers", absorbing the excess mechanical energy of the cantilever when in motion, thus improving its shock resistance. To this end, in embodiments with mechanical stops 51 that also serve as shock absorbing bumpers, the mechanical stops 51 may be made of a material with a shock absorbing property such as rubber or the like.

FIG. 14A illustrates one embodiment with the mechanical stops 51 placed on the inner sides of the base 102 and the lid 104. The mechanical stops 51 are positioned and configured to come in contact with the piezoelectric member at its point of maximum deflection. When designing the embodiment, a specific value of maximum deflection may be used. As shown in FIG. 14A, in the specific embodiment where the piezoelectric member 2 is a single clamped cantilever, the mechanical stops 51 may be placed on the inner sides of the base 102 and the lid 104, above and under the free end of the piezoelectric member 2, where the deflection is a maximum.

In preferred embodiments, the shape of the mechanical stops 51 may be optimized in order to reduce the mechanical stress inside the piezoelectric member 2, when the piezoelectric member 2 comes into contact with the mechanical stops 51. Accordingly, the mechanical stops may be designed and/or shaped to touch the piezoelectric member partially, or on all its area. FIG. 14C shows an example of mechanical stops 51 that are triangular in design with a flat surface designed to mate with the flat surface of the proof mass 5 on the end of the cantilevered piezoelectric member 2. Accordingly, as may be seen in FIG. 14C, the piezoelectric member's point of maximum deflection is restricted by the flat surface of the triangular stops 51.

In yet other embodiments, the stops may be placed on the piezoelectric member. FIG. 14B illustrates a piezoelectric member 2, cantilevered with a proof mass 5 coupled to the end of piezoelectric member 2. The mechanical stops 51 are coupled to the end of the proof mass 5 rather than being coupled to the package. In still other embodiments, the stops may be functionality integrated into the proof mass. In still yet other embodiments, mechanical stops 51 may be placed on both the piezoelectric member 2 and the package.

In some embodiments, the material of the mechanical stops 51 may be, but is not limited to, fiberglass-reinforced epoxy laminate (FR4), silicon or a polymer such as epoxy, polytetrafluoroethylene (PTFE), parylene or silicone rubber.

The mechanical stops may be coupled or attached to the device in various different ways. In some embodiments, the stops 51 may be placed by gluing or soldering. In yet other embodiments, the stops 51 may be deposited by screen-printing, additive printing or dispensed in a fluid form (later cured or dried).

Figure 15:
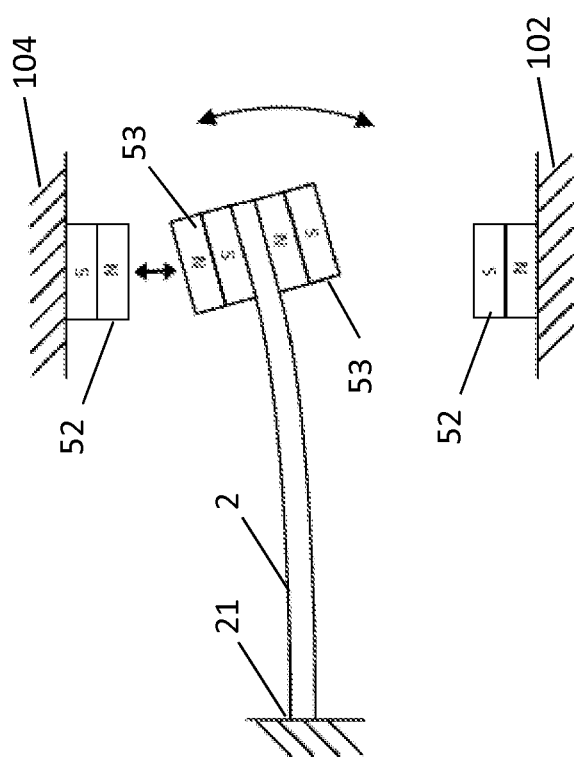
FIG. 15 illustrates an embodiment including magnetic stops for a cantilevered piezoelectric member.

In other embodiments, the stops may employ magnetic principles instead of mechanical ones. As may be seen in FIG. 15, the stops 52 may be permanent magnets, placed on the inner sides of the base 102 and the lid 104, while one or more permanent magnets 53 are placed on the piezoelectric member 2. The magnets 53 placed on the end of piezoelectric member 2 may also double as a proof mass 5. The magnetic field of the magnets is configured to provide a repelling force between the magnet placed on the inner side of the base 102 or the lid 104 and the one placed on the piezoelectric member, thus limiting the deformation of the piezoelectric member. For example, the magnets 53 placed on the end of the piezoelectric member 2 and the magnetic stops 52 have similar poles facing each other such that they repel with increased strength as the distance between the two is reduced. The use of magnetic stops 52 provides a robust implementation where there is no need for mechanical contact of the stop 52 and the piezoelectric member 2.

The use of a piezoelectric member assembled into a sealed package, having cavities, stops, electrical connection pads and mechanical anchor points enables a ready-to-use energy harvesting unit for vibration harvesting.

Figure 16:
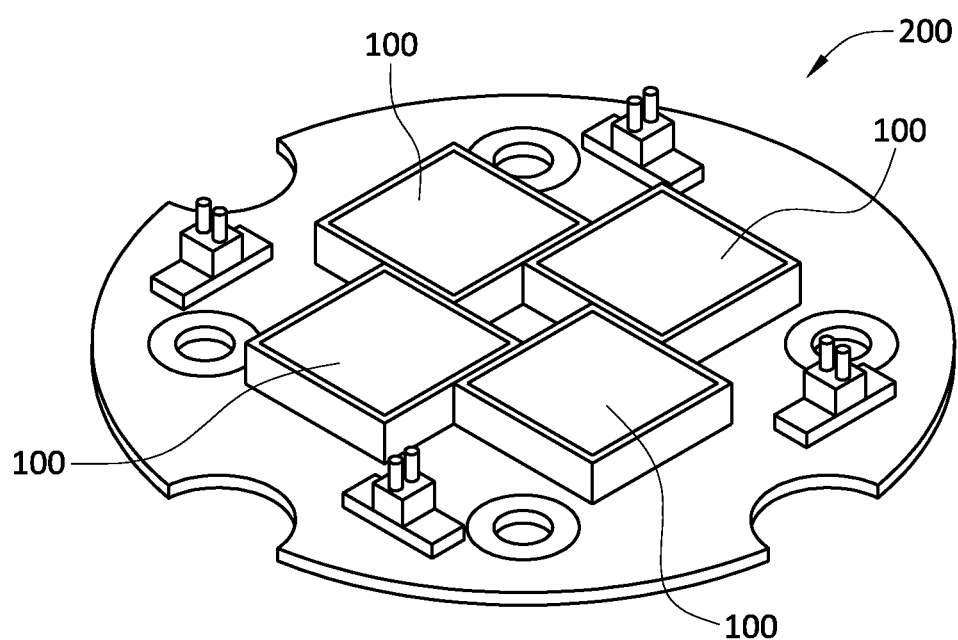
FIG. 16 illustrates an isometric view of an embodiment of an electrical generating unit including four energy harvesting units.

As may be seen in FIG. 16, in some embodiments, a generating unit 200 may comprise one or more energy harvesting units 100. More than one energy harvesting unit 100 may improve the total output power level available for the generating unit 200. More than one energy harvesting unit 100 may be configured to increase the usable frequency bandwidth of the input vibrations by incorporating energy harvesting devices with different frequency responses. In some embodiments, the energy harvesting units 100 within a generating unit 200 may be oriented along different axes such that they are sensitive to vibration in different axes.

The number and the resonance frequencies of energy harvesting units 100 assembled on the generating unit 200 may be changed and optimized to meet the specific application. In particular, if the energy harvesting units 100 have the same resonance frequency, the energy converted at that specific frequency will improve significantly. On the other hand, if the energy harvesting units 100 have different resonance frequencies, energy will be generated over a wider frequency bandwidth of the input vibrations; due to the different contributions of the energy harvesting units 100 at different frequencies.

Figure 17:
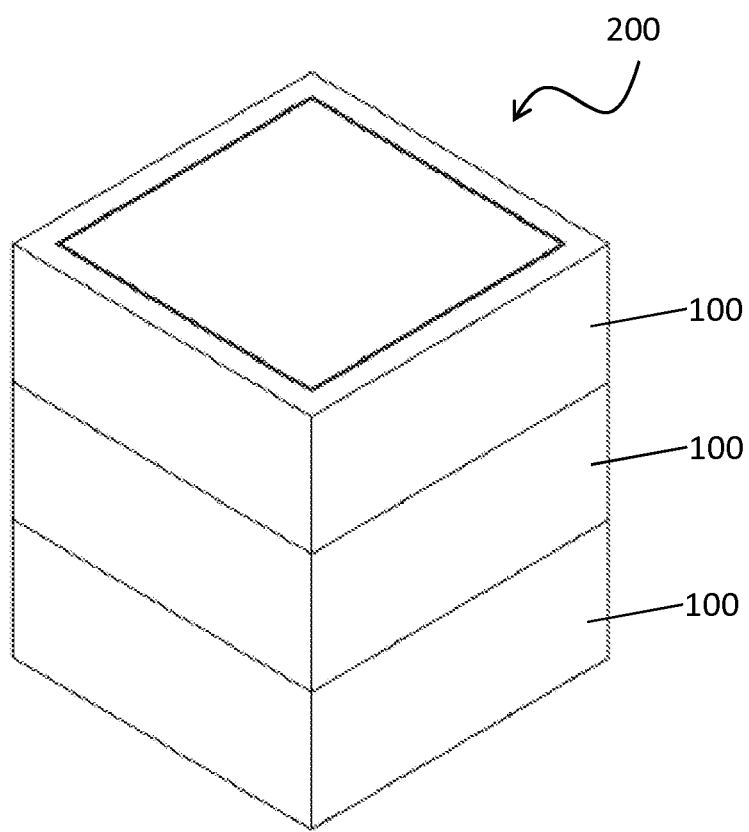
FIG. 17 illustrates an isometric view of an embodiment of an electrical generating unit with three energy harvesting units stacked vertically one on top of the other.
Figure 18:
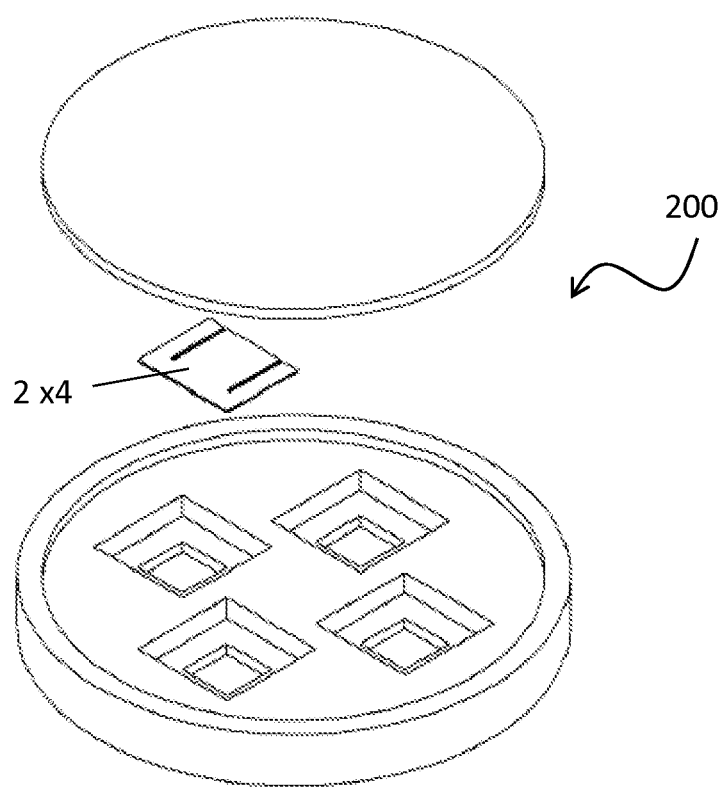
FIG. 18 illustrates an isometric view of an embodiment of an electrical generating unit.
Figure 19A:
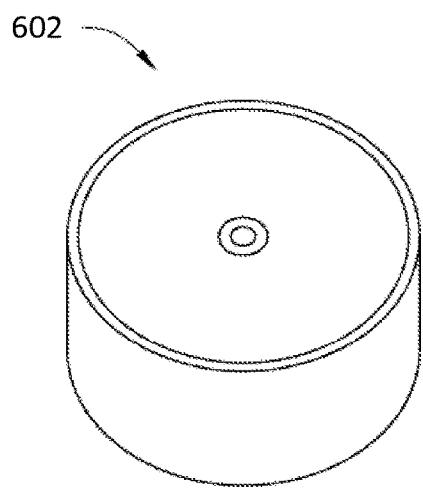
FIG. 19A illustrates an isometric bottom view of a wireless sensor node of FIG. 19B.
Figure 19B:
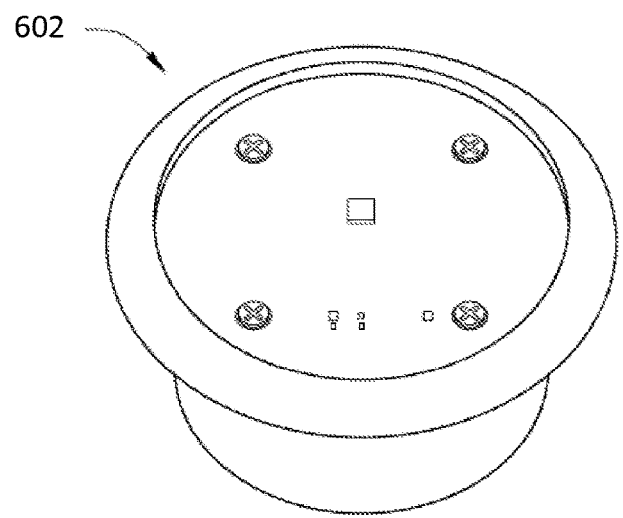
FIG. 19B illustrates an isometric top view of a wireless sensor node that incorporates an electronic unit and a generating unit.
Figure 19C:
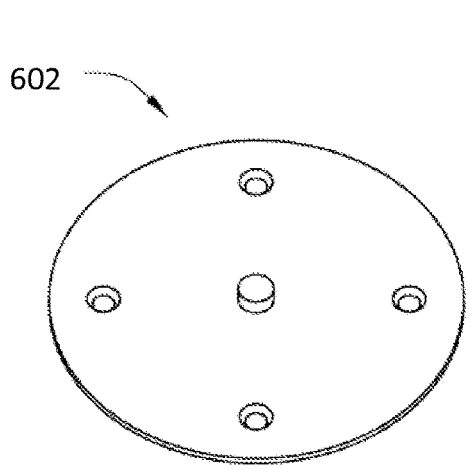
FIG. 19C illustrates the electronic unit for use in the wireless sensor node of FIG. 19B.
Figure 19D:
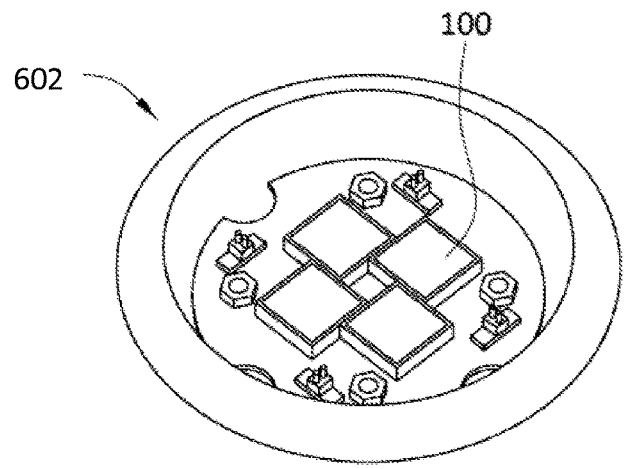
FIG. 19D illustrates the same view as FIG. 19B only with the electronic unit removed such that the energy generating unit including four energy harvesting units may be seen.
Figure 20:
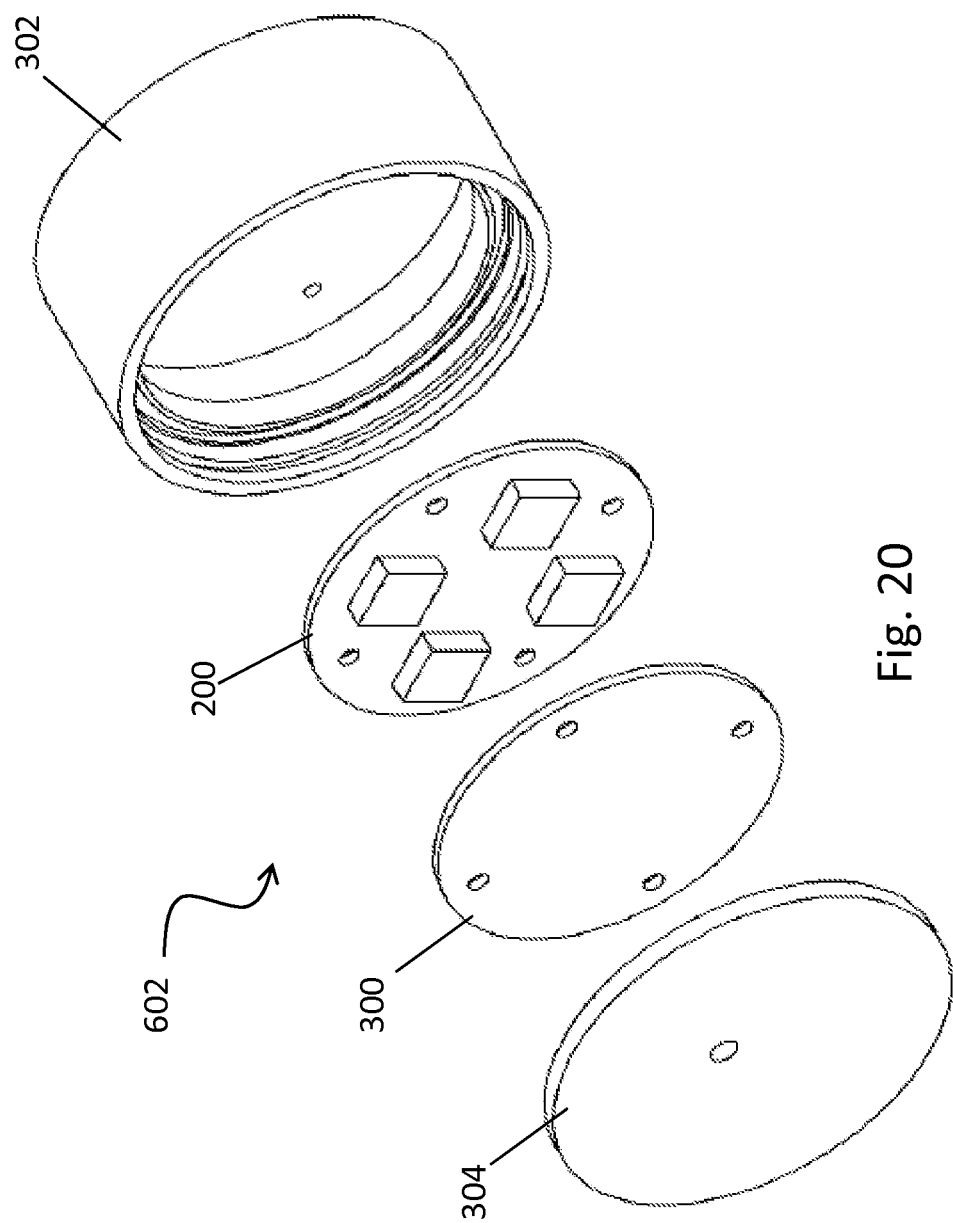
FIG. 20 illustrates an exploded view of one embodiment of a wireless sensor node including an electronic unit and a generating unit.

As may be seen in FIG. 17, in some embodiments, the generating unit 200 may comprise one or more energy harvesting units 100 stacked together. As may be seen in FIG. 18, one or more piezoelectric members 2 may be assembled in a single package 200.

As may be seen in FIGS. 19A-19D and 20, in some embodiments, the generating unit(s) 200 may be used for powering an electronic unit 300. In such embodiments, the generating units may be coupled to the electronic unit 300 as a completely separate component or they may be integrated with the electronics of the electronic unit. In the example shown in FIGS. 19A-19D, each embodiment is made of a generator board and an electronic board stacked together in a hermetic metal housing with a lid made out of acetal copolymer. As may be seen in FIG. 22, the generating unit may be integrated directly onto the printed circuit board (PCB) of the electronic unit 300.

In one preferred embodiment, the generating units 200 may be used in a wireless sensor node 602 as power supplies for the various sensors. Preferably, the generating units 200 and the electronic unit 300 are encapsulated in a sealed housing with an interior configured to protect the generating unit 200. As may be seen in FIG. 20, the wireless sensor node 602 may have a base 302 and a lid 304 that seals the entire generating unit 200 and the electronic unit 300. In a preferred embodiment, the packaged units may have an exterior with a connection means for connection to a moving object.

The use of a sealed housing enables the use of the generating unit 200 and the electronic unit 300 in harsh environments, where there is a high pressure and/or high humidity and/or high/low temperatures. The generating units 200 may be able to provide power in environments where batteries will not be able to operate.

Figure 21:
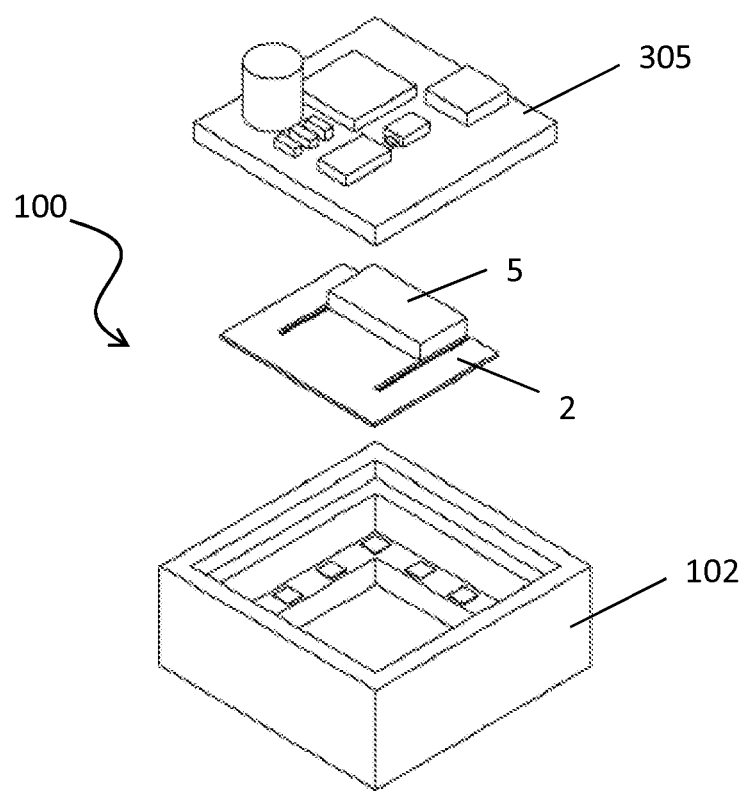
FIG. 21 illustrates an exploded view of one embodiment of an energy harvesting unit including an electronics package.

In other embodiments, the electronics 305 may be embedded in the generating unit, or in the energy harvester unit 100, as shown in FIG. 21. Embedding the electronics in the energy harvester unit 100 reduces the overall footprint and, forms a miniaturized device.

Figure 22B:
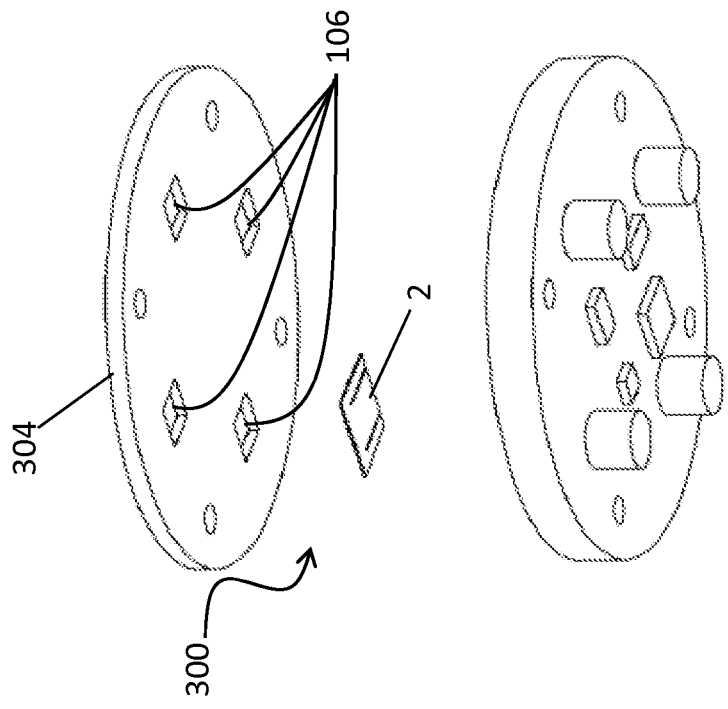
FIGS. 22A and 22B illustrate exploded views of one embodiment of an electronic unit with 4 energy harvesters integrated directly into it.
Figure 22A:
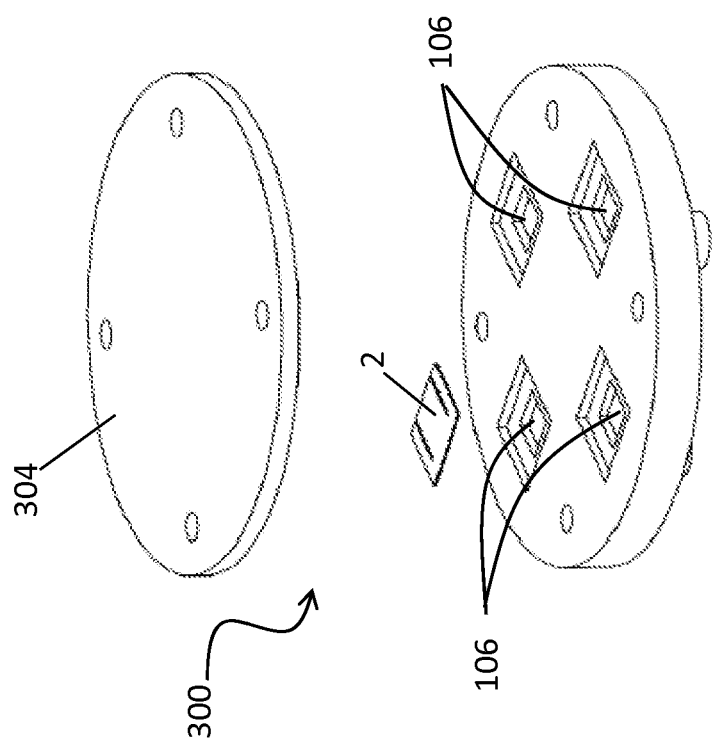

FIGS. 22A and 22B illustrate exploded isometric views of an electronic unit 300 with an energy harvesting generator integrated directly into it. In embodiments where the generating unit 200 is integrated directly into the electronic unit 300, the electronic unit 300 may comprise cavities 106 to accommodate one or more piezoelectric members 2 and one or more lids 304 configured to seal the piezoelectric members 2; with the lid(s) 304 that may comprise cavities 106.

Figure 23:
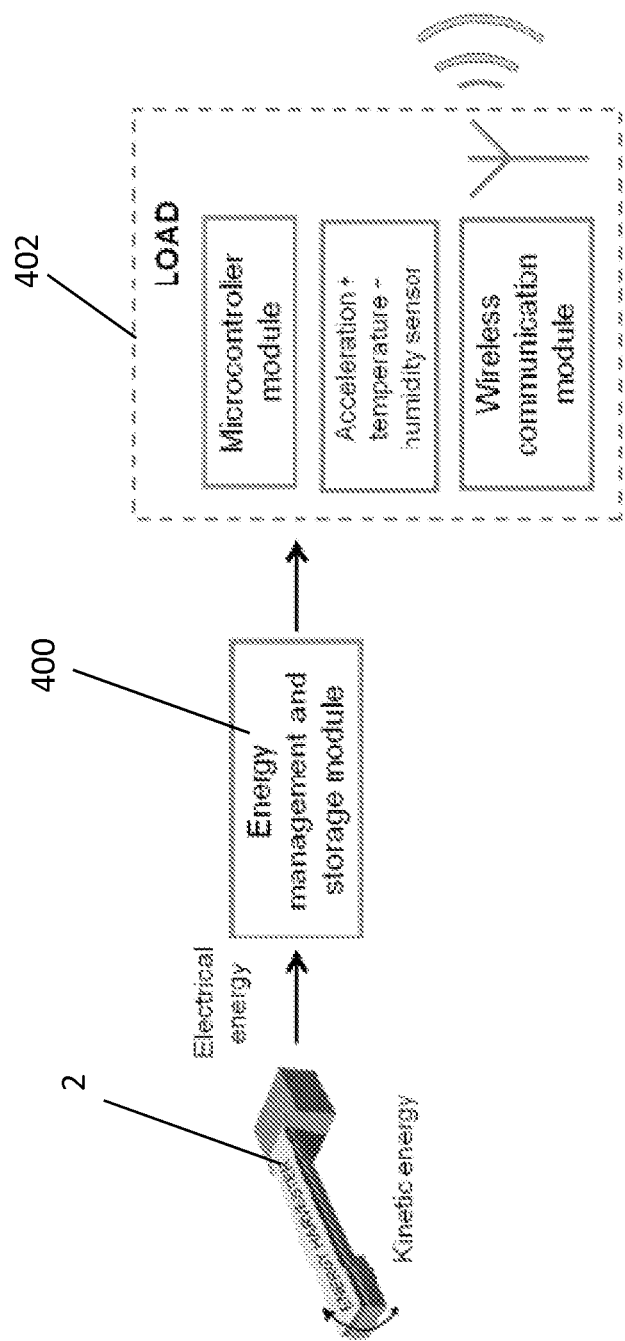
FIG. 23 illustrates a function diagram of an electronics sensor package including an energy harvester and energy management and storage module.

FIG. 23 illustrates an embodiment further comprising an energy management and storage module 400 configured to properly condition and collect the electrical energy converted by the piezoelectric member 2. In embodiments like the one shown in FIG. 23, the energy harvesting unit produces electrical current from kinetic energy. The electrical current is managed and/or stored by the energy management unit 400 and distributed to the load 402 as needed. When the collected energy is enough, the load is powered and the node starts up. In a preferred embodiment, each sensor node is equipped with an ultra-low power microcontroller, an acceleration sensor, a temperature/humidity sensor and a wireless RF transceiver. In the embodiment shown in FIG. 23, the load 402 comprises a microcontroller, wireless communication unit and sensor(s). In other embodiments, the load may be comprised of other power consuming components.

Figure 24:
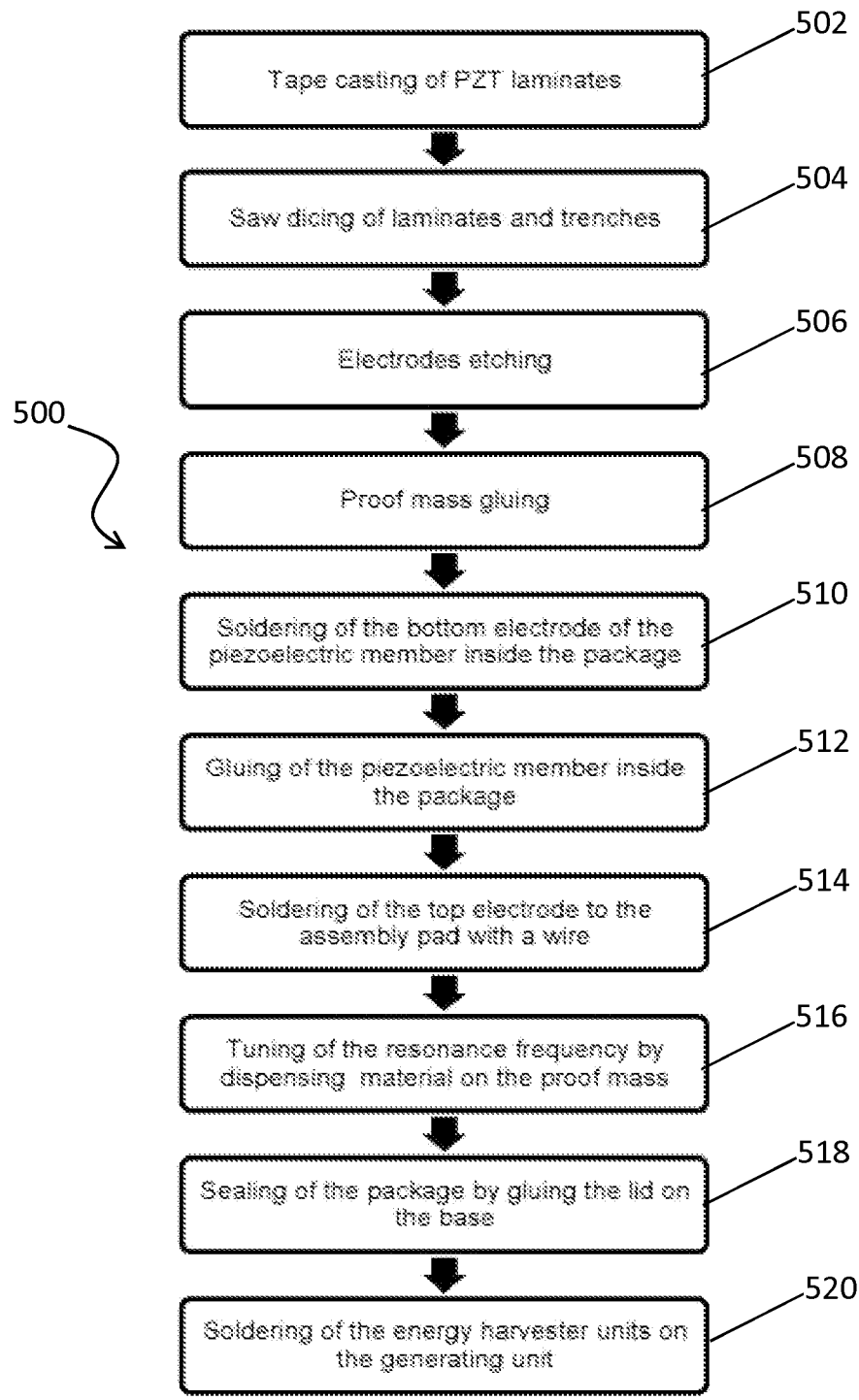
FIG. 24 illustrates a flow diagram of one embodiment of manufacturing a generating unit including at least one energy harvester.

FIG. 24 illustrates one embodiment of a process 500 for making a generating unit 300. The first step of the process 500 is tape casting the PZT laminates 502. Once the PZT laminates are formed, the laminates and trenches may be saw diced 504. Next the electrodes are etched 506. If the embodiment is to include a proof mass, it may be coupled to the PZT laminates at this stage. In this particular embodiment, the proof mass is glued 508. Next the bottom electrode of the piezoelectric member may be electrically coupled to the pads or other connectors inside of the package or container. In this embodiment, the bottom piezoelectric member is soldered 510. Once the bottom piezoelectric member is electrically connected, the piezoelectric member may be physically coupled to the package or container. In the process embodiment of FIG. 24, the piezoelectric member is glued inside the package in step 512. Next the top electrode must be electrically connected. In the preferred embodiment of the process, the top electrode is soldered to the assembly pad with a wire 514. If the piezoelectric member needs to meet specific frequency requirements, the resonance frequency may be tuned in step 516. Preferably, the resonance frequency is tuned by dispensing material on the proof mass in step 516. At this stage the energy harvesting unit is ready to go and it may be sealed up. In the process illustrated in FIG. 24, the lid is glued to the base to seal the package in step 518. Finally, in embodiments where the generating unit comprises more than one energy harvesting unit, multiple energy harvesting units may be electrically connected to the generating unit in step 520.

Figure 25:
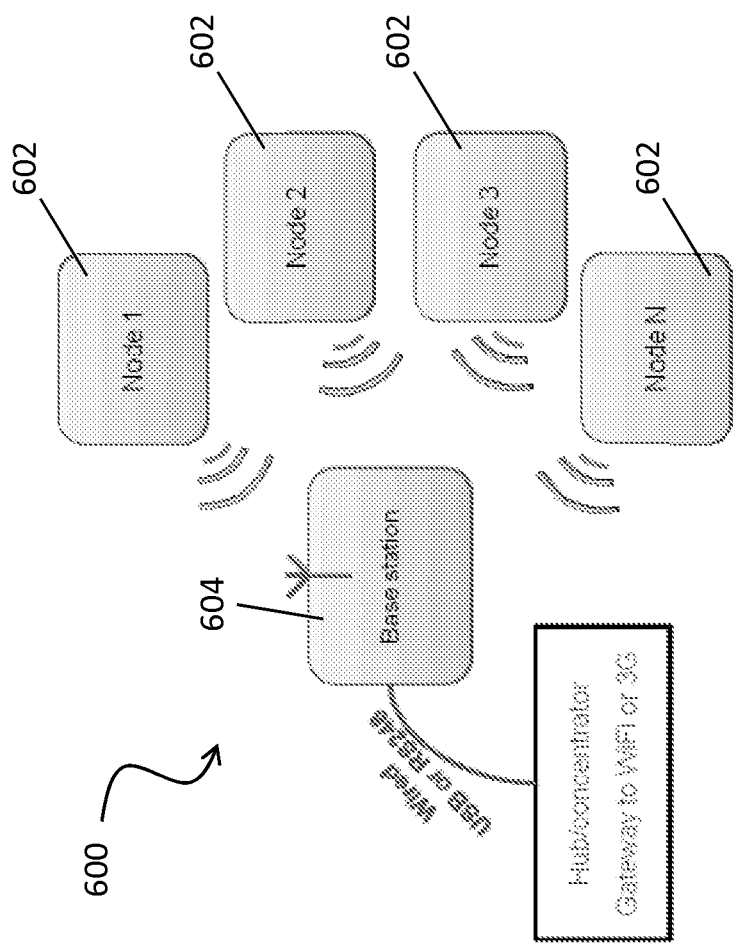
FIG. 25 illustrates a system architecture for a wireless sensor system incorporating energy harvesters.

In a preferred implementation, energy harvesters may be used as part of a wireless sensor system. FIG. 25 illustrates a schematic diagram of the system architecture for a wireless sensor system 600 using energy harvesters. The basic building block of the system is a wireless sensor node 602, powered by vibration energy harvesting. The sensor nodes 602 are able to measure different physical quantities and send the data through a radio link to a base station 604. As shown in FIG. 25, several sensor nodes 602 may be connected in a star-like network topology. The base station 604 may be connected to a hub that collects data enabling further analysis and presentation.

In a preferred embodiment, the energy harvesting based wireless sensor network (WSN) 600 has a star topology with unidirectional transmission, from the sensor node to the base station. The network may support up to 256 sensors nodes that transmit data through a 2.4 GHz radio link using a proprietary transmission protocol. In a preferred embodiment, the transmission distance is in the range 3÷0 m. In other embodiments, other distances may be supported. In some embodiments, the transmission distance may be up to 100 m. A base station 604 receives incoming RF data packets from the nodes 602, checks their integrity and forwards raw data to a hub/web server through the USB/RS485 port. On the web server side, MySql client or other database client collects the incoming data and stores it in a database. Data access is possible through a web database interface accessible to the users connected to the network (Ethernet, WiFi or 3G).

Some of the main advantages of the sensor nodes 602 powered by energy harvesters are low weight, energy autonomy, wireless, long life and a wide range of working temperatures. The distinctive characteristic of the sensor system is the exploitation of energy harvesting technique for powering the sensor node, completely eliminating the use of batteries. In preferred embodiments, the energy harvester can convert numerous different types of motion into energy including: Harmonic vibration; Non-harmonic vibration; Rotation; Displacement; Torque; Acoustic wave.

Various different energy conservation techniques may be used in order to keep the load of the sensor low enough to allow the energy harvester to provide the required amount of power. For example, after the start-up, the microcontroller may alternate between measurement of physical quantities (acceleration/temperature/humidity) and data transmission with sleep intervals, until the power harvested from the environment is enough to keep the system running continuously. Due to low energy availability, the node may operate with a low duty-cycle. In some embodiments, the ratio between active operations (measurements and data transmissions) and sleep interval is typically around 0.1%. In other embodiments the ration between active operation and sleep intervals may be between 0 and 1%. In yet other embodiments the ratio may be between 1% and 5%.

Figure 26:
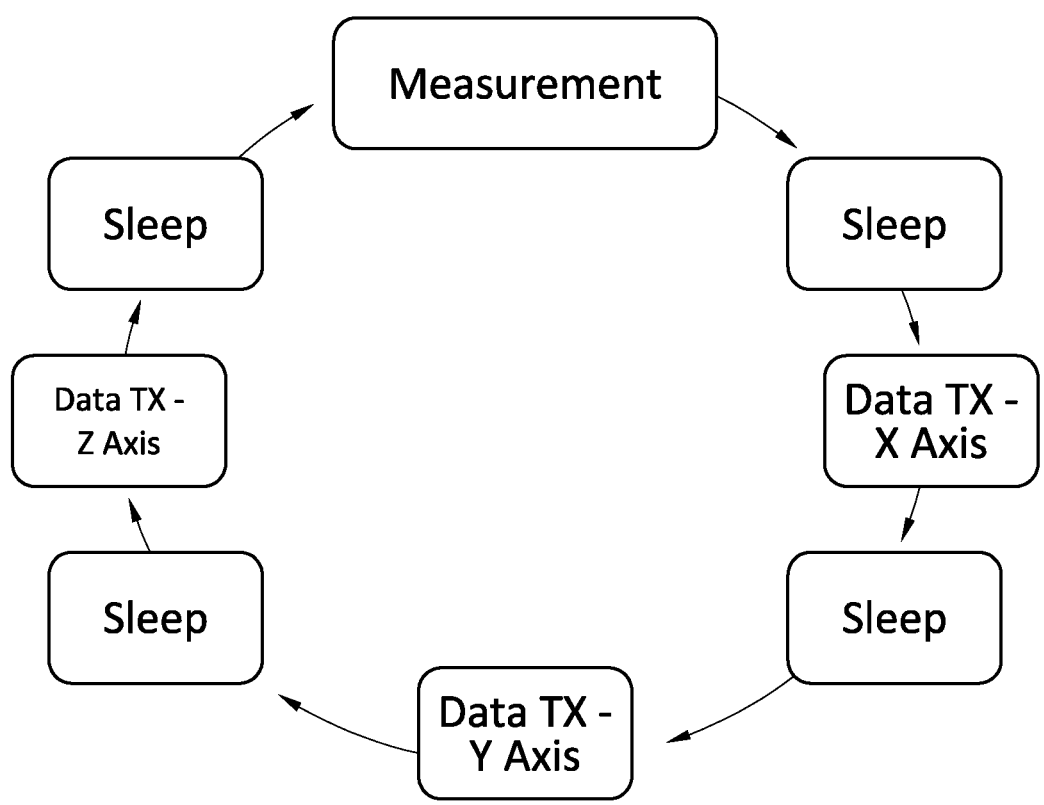
FIG. 26 illustrates a duty-cycle of one embodiment of a sensor node powered by one or more energy harvesters.

FIG. 26 illustrates a cycle that may be used for one embodiment of a sensor node. As may be seen in FIG. 26, measurement and transmission of data collected for each axis are interleaved with sleep intervals. In other embodiments, other cycles may be used and more than one axis may be transmitted consecutively. As just one example, the minimal requested acceleration level may be approximately 0.3 g RMS, while working frequency is tunable in a broad range. With an input acceleration level of 0.3 g RMS, and working excitation frequency of 300 Hz the sleep interval can be as short as 30 s enabling the powering of a wireless sensor node, performing acceleration, temperature and humidity measurement.

Although the embodiments have been described with reference to preferred configurations and specific examples, it will readily be appreciated by those skilled in the art that many modifications and adaptations of the electronic device and methods described herein are possible without departure from the spirit and scope of the embodiments as claimed hereinafter. Thus, it is to be clearly understood that this description is made only by way of example and not as a limitation on the scope of the embodiments.

What is claimed is:
1. An energy harvesting unit comprising:
    a base including a first cavity forming a ledge in the base and a second cavity stepped down from the ledge;
    a plurality of electrical contacts formed on the ledge;
    a plurality of electrical contacts formed on a bottom of the base and in electrical communication with the electrical contacts formed on the ledge;
    a lid coupled to the base to form a sealed interior volume; and,
    a piezoelectric member located in the sealed volume and electrically coupled to the electrical contacts formed on the ledge, the piezoelectric member spanning across the second cavity and extending over three sides of the ledge, the piezoelectric member including at least two gaps positioned over the second cavity forming a cantilevered portion extending over the second cavity.

2. The energy harvesting unit of claim 1, further comprising a proof mass coupled to the cantilevered portion of the piezoelectric member.

3. The energy harvesting unit of claim 2, further comprising a second proof mass coupled to the cantilevered portion of the piezoelectric member.

4. The energy harvesting unit of claim 1, wherein the piezoelectric member is a bimorph member.

5. The energy harvesting unit of claim 1, wherein the piezoelectric member is manufactured using a ceramic multilayer technology.

6. The energy harvesting unit of claim 5, wherein the piezoelectric member is manufactured using a tape casting.

7. The energy harvesting unit of claim 1, wherein the piezoelectric material of the piezoelectric member is PZT (Lead Zirconate Titanate).

8. The energy harvesting unit of claim 1, wherein the interior volume is hermetically sealed or vacuum sealed.

9. The energy harvesting unit of claim 1, further comprising a first mechanical stop coupled to the lid and a second mechanical stop coupled to the base.

10. The energy harvesting unit of claim 2, further comprising a first mechanical stop coupled to a top of the proof mass and a second mechanical stop coupled to a bottom of the proof mass.

11. The energy harvesting unit of claim 2, further comprising a magnet coupled to the proof mass and a first magnetic stop coupled to the lid and a second magnetic stop coupled to the base.

12. The energy harvesting unit of claim 1, comprising one or more magnetic proof masses enabling magnetic coupling to an external magnetic field.

13. The energy harvesting unit of claim 1, wherein the piezoelectric member has a Q-factor of 200 or less.

14. An energy harvesting unit comprising:
- a package formed by a base and a lid, the package including a sealed interior volume and an exterior;
- a ledge formed in the sealed interior volume with a first cavity above and a second cavity below the ledge;
- a plurality of inner electrical contacts formed on the ledge;
- a plurality of outer electrical contacts formed on the exterior of the package wherein the outer electrical contacts are electrically connected to the inner electrical contacts through the package; and,
- a piezoelectric member in electrical communication with the inner electrical contacts and spanning across the cavity and coupled to the ledge on three sides of the package.

15. The energy harvesting unit of claim 14, further comprising a proof mass coupled to the piezoelectric member.

16. The energy harvesting unit of claim 14, wherein the piezoelectric member includes a cantilevered portion surrounded by an outer frame on three sides and wherein the outer frame is coupled to the ledge on the first side and the opposite side and on an adjacent third side and wherein the cantilevered portion is suspended between the first and second cavity.

17. The energy harvesting unit of claim 16, wherein the piezoelectric member includes a frame on all four sides.

18. The energy harvesting unit of claim 14, wherein the first cavity is formed in the lid and the ledge and the second cavity are formed in the base.

19. The energy harvesting unit of claim 14, wherein the piezoelectric member is a bimorph member.

20. The energy harvesting unit of claim 14, wherein the piezoelectric member has a Q-factor of 200 or less.

21. A wireless node comprising:
- a processing unit;
- at least one energy harvesting unit of claim 14;
- an energy management and storage module in electrical communication with the energy harvesting unit and the processing unit; and,
- a wireless communication module.

22. The wireless node of claim 21, further comprising at least one sensor component.

* * * * *